United States Patent
Bessho et al.

(10) Patent No.: US 7,504,926 B2
(45) Date of Patent: Mar. 17, 2009

(54) FUSE MODULE

(75) Inventors: Terutaka Bessho, Yokkaichi (JP); Yoshikazu Sasaki, Yokkaichi (JP); Tomohiro Babasaki, Yokkaichi (JP); Tomoki Kanou, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 168 days.

(21) Appl. No.: 10/586,906

(22) PCT Filed: Feb. 18, 2005

(86) PCT No.: PCT/JP2005/002568

§ 371 (c)(1),
(2), (4) Date: Jul. 24, 2006

(87) PCT Pub. No.: WO2005/081279

PCT Pub. Date: Sep. 1, 2005

(65) Prior Publication Data

US 2007/0241858 A1 Oct. 18, 2007

(30) Foreign Application Priority Data

Feb. 19, 2004 (JP) ............................. 2004-042636

(51) Int. Cl.
*H01H 85/04* (2006.01)
(52) U.S. Cl. ...................................... 337/283; 337/189
(58) Field of Classification Search ................. 337/189, 337/283
See application file for complete search history.

(56) References Cited

U.S. PATENT DOCUMENTS 5,038,050 A 8/1991 Minoura (Continued)

FOREIGN PATENT DOCUMENTS

DE 103 02 372 A1 7/2003

(Continued)

*Primary Examiner*—Anatoly Vortman
(74) *Attorney, Agent, or Firm*—Oliff & Berridge, PLC

(57) ABSTRACT

It is an object to provide a fuse module having a power distribution function of distributing a common power to a plurality of power input sections and a function of protecting a circuit from an overcurrent during the power distribution based on fuse elements interposed in the circuit, while allowing for replacement and concentrated management of the fuse elements. A fuse module as specific means for achieving the object is adapted to connect a common power supply to a plurality of power-input sections of a circuit assembly, and provided with an insulation housing 52, a branch-connection conductor 54 and a plurality of power-input conductors which are held in the insulation housing. The branch-connection conductor 54 has an input terminal 55 adapted to be connected to the power supply, and a plurality of fuse-connection terminals 54a disposed correspondingly to the respective power-input sections. Each of the power-input conductors is electrically connected to a corresponding one of the power-input sections, and has a fuse-connection terminal and disposed in a pair with a corresponding one of the fuse-connection terminals 54a. Then, a fuse element is installed in each of a plurality of fuse-installation portions arranged in the insulation housing 52 so as to be connected to the fuse-connection terminal 54a of the branch-connection conductor 54 and the corresponding fuse-connection terminal of the power-input conductor to be interposed between the fuse-connection terminals of the pair.

13 Claims, 14 Drawing Sheets

U.S. PATENT DOCUMENTS

| | | | |
|---|---|---|---|
| 5,088,940 A * | 2/1992 | Saito | 439/620.34 |
| 5,229,922 A | 7/1993 | Muramatsu et al. | |
| 5,438,310 A * | 8/1995 | Ikari | 337/208 |
| 5,643,693 A * | 7/1997 | Hill et al. | 429/121 |
| 5,731,944 A * | 3/1998 | Yasukuni et al. | 361/104 |
| 5,886,611 A * | 3/1999 | Schaller et al. | 337/189 |
| 6,396,380 B1 * | 5/2002 | Girke et al. | 337/189 |
| 6,514,091 B2 | 2/2003 | Saito et al. | |
| 6,724,627 B2 * | 4/2004 | Onizuka et al. | 361/704 |
| 6,785,139 B2 | 8/2004 | Onizuka et al. | |
| 6,914,765 B2 | 7/2005 | Nakamura et al. | |
| 7,203,073 B2 | 4/2007 | Kawakita et al. | |
| 2002/0080562 A1 | 6/2002 | Nakamura et al. | |
| 2004/0001319 A1 | 1/2004 | Kawakita et al. | |
| 2006/0119463 A1 * | 6/2006 | Kubota | 337/182 |

FOREIGN PATENT DOCUMENTS

| | | |
|---|---|---|
| DE | 103 29 650 A1 | 1/2004 |
| JP | A-11-285132 | 10/1999 |
| JP | A-2000-125449 | 4/2000 |
| JP | A 2001-286037 | 10/2001 |
| JP | A 2002-262436 | 9/2002 |
| JP | A 2004-40873 | 2/2004 |

* cited by examiner

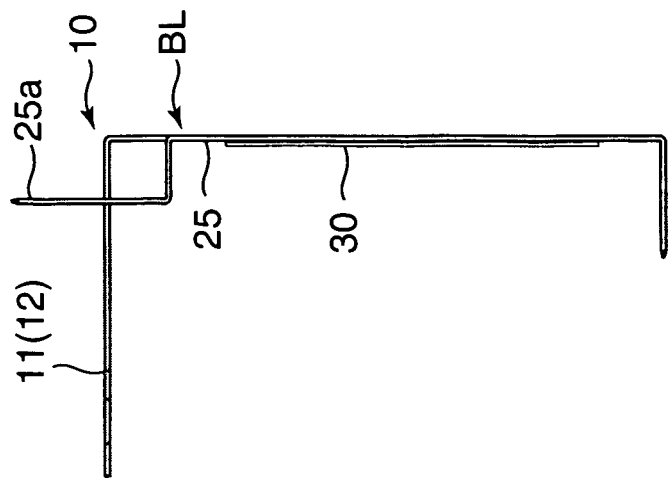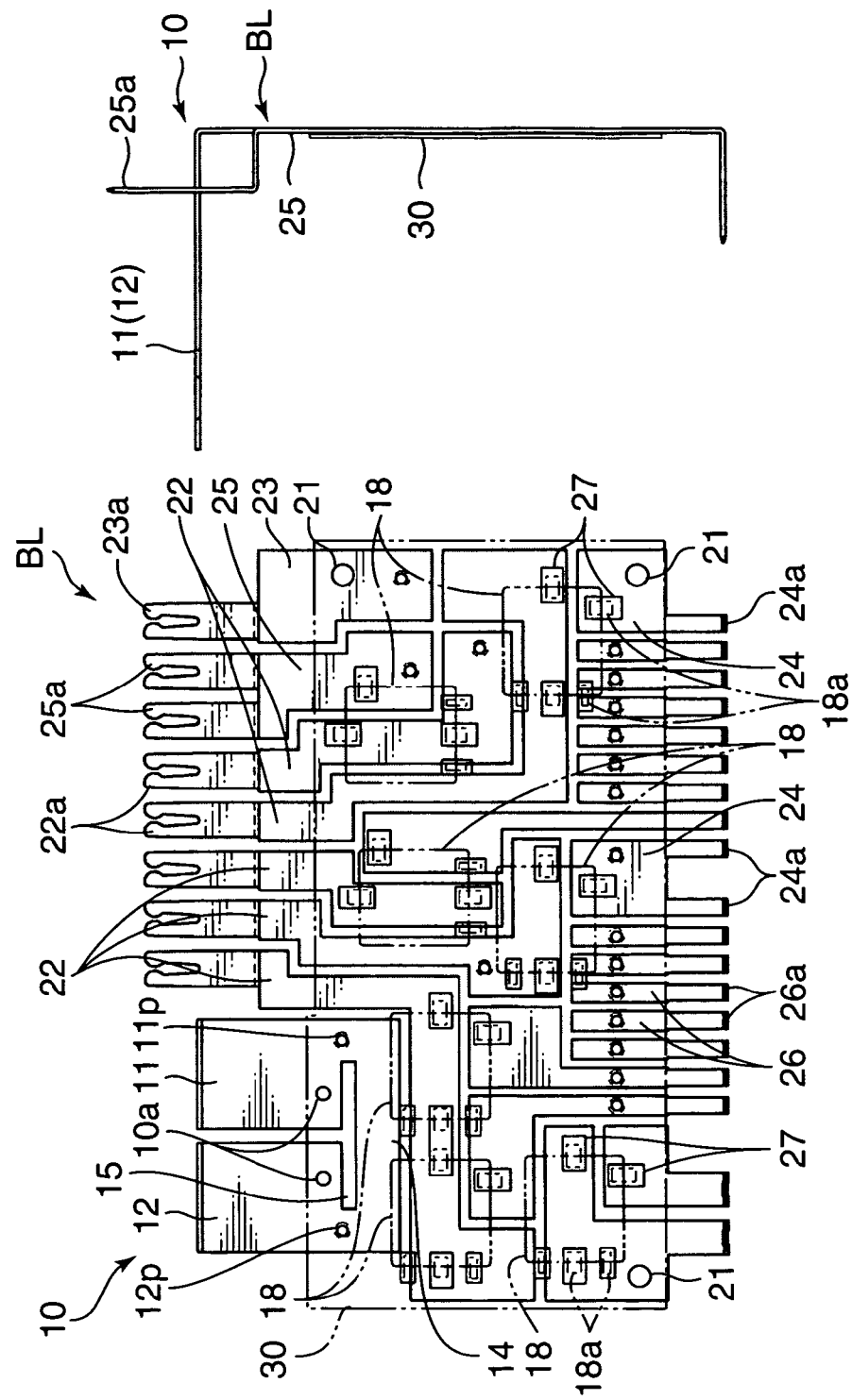

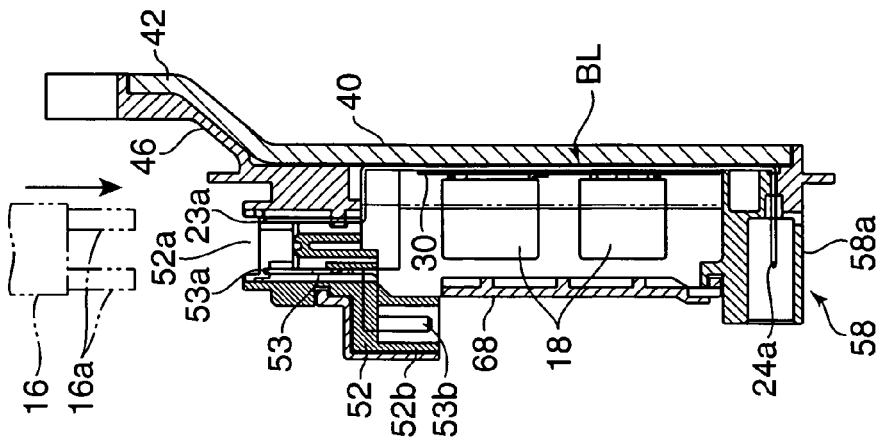
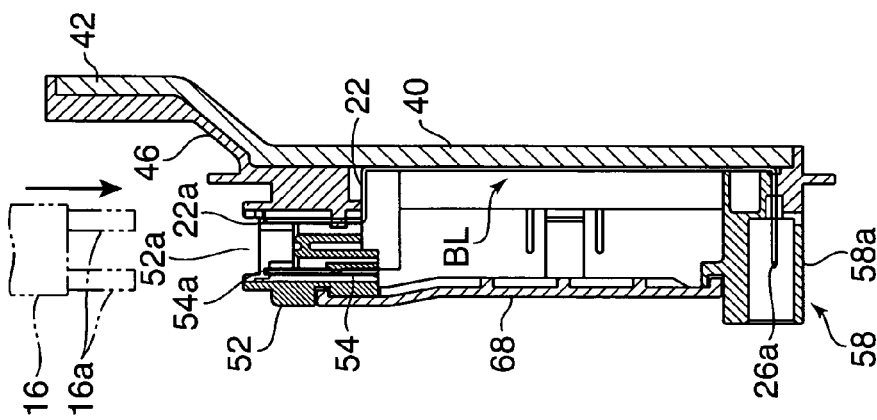
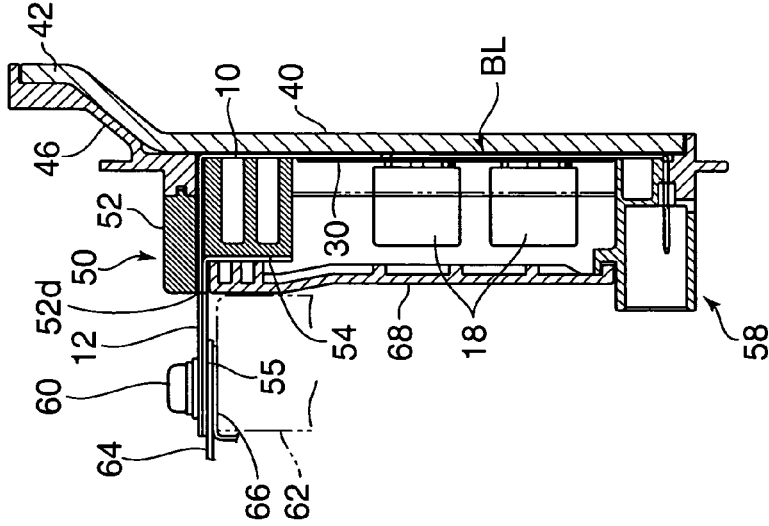

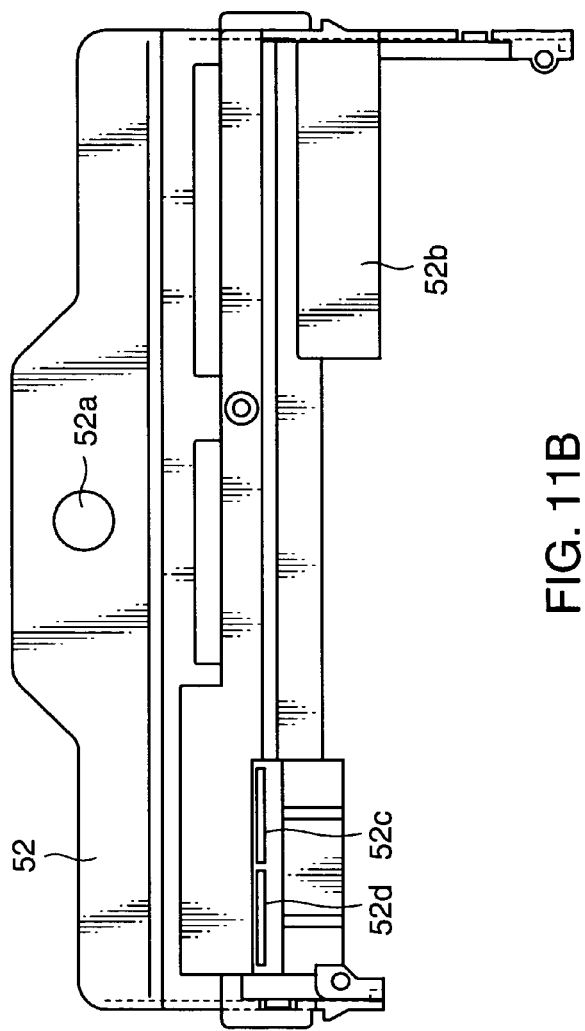
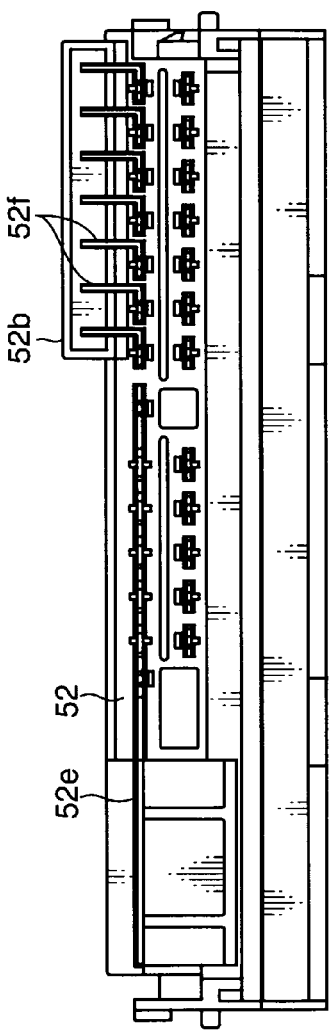
FIG. 11A
FIG. 11B

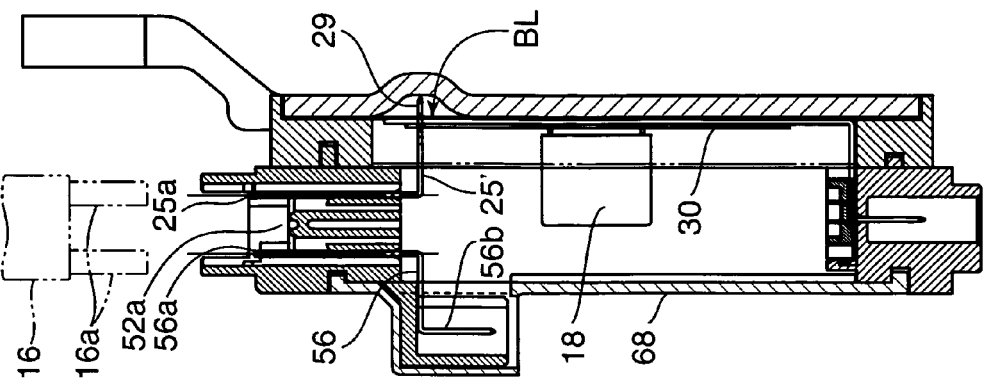
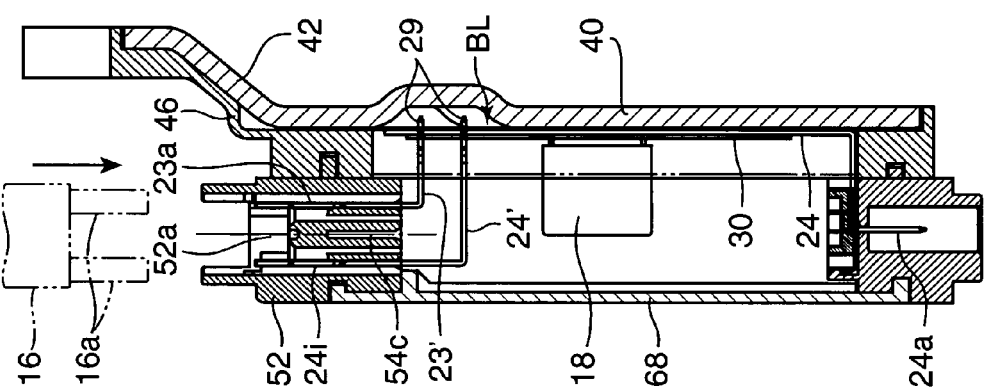
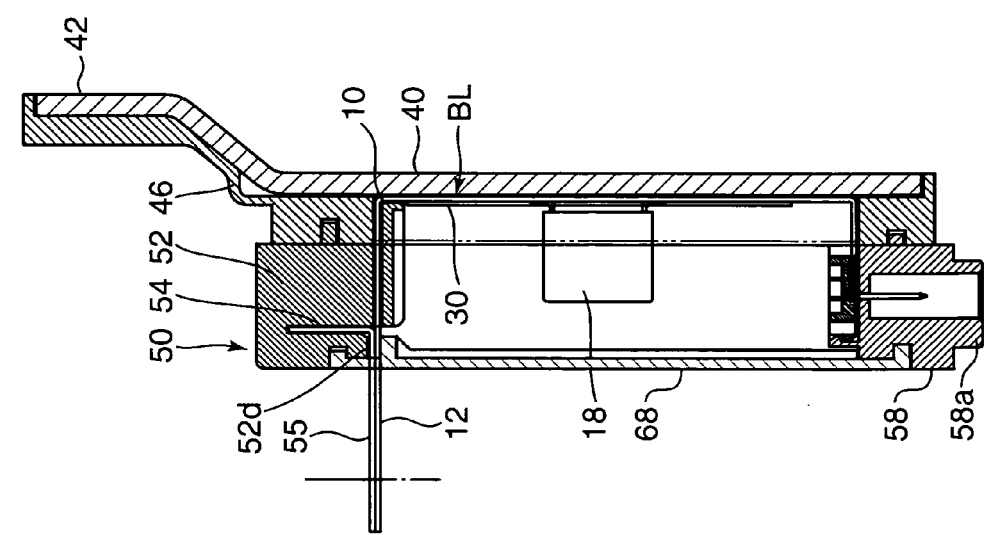

FUSE MODULE

TECHNICAL FIELD

The present invention relates to a fuse module to be interposed between a power supply and a circuit assembly mounted on an automobile or the like.

BACKGROUND ART

Heretofore, as a circuit assembly for distributing a power from a common power supply to a plurality of loads in a vehicle such as an automobile, there has been generally known an electric connection box including a bus bar board. The bus bar board is of a laminated construction with alternating bus bar layers serving as a power circuit and insulating plates. From each of the bus bar layers are perpendicularly bent a plurality of tab terminals, to which circuit-protective fuse elements and switching elements such as a relay switch are connected.

Late years, there has also been known a power distributor intended to reduce a thickness of the circuit assembly, as disclosed in the following Patent Publication 1. In this power distributor, a switching element consisting of a FET or the like is interposed between a power-input bus bar and each of a plurality of output bus bars. Each of the output bus bars is divided into two segments at an intermediate position thereof, and a fuse member is welded to the segments so as to bridge therebetween. According to this power distributor, a thickness of the entire circuit assembly can be reduced. Further, even if the switching element fails to be turned off during occurrence of an overcurrent, a circuit and a vehicle-mounted load on a downstream side of the fuse member is protected from the overcurrent since the fuse member in the output bus bar associated with the failed switching element is fused.

Patent Publication 1: Japanese Patent Laid-Open Publication No. 2001-286037

In the aforementioned structure where the fuse element is attached to each of the tab terminals perpendicularly bent from the bus bar board in place, the fuse elements are scattered on the bus bar board, which is liable to cause structural complexity, and difficulty in concentrated management of the fuse elements in one place.

In the power distributor disclosed in the Patent Publication 1, the fuse member cannot be replaced with a new one when burned out, because the fuse member is welded to be integrally incorporated in each of the output bus bars of the power distributor. Consequently, the application of this fuse member is liable to be limited to a region with extremely low possibility of meltdown, like a region where a fail-safe fuse for the occasion when a switching element such as a FET fails to be turned off in spite of occurrence of overcurrent is set.

SUMMARY OF THE INVENTION

In view of the above circumstances, it is an object of the present invention to provide a fuse module capable of having a power distribution function of distributing a common power to a plurality of power input sections and a function of protecting a circuit from an overcurrent with fuse elements interposed in the circuit during the power distribution, while enable replacement and concentrated management of the fuse elements. The present invention provides a fuse module for supplying a power from a common power supply to a plurality of power input sections of a circuit assembly through respective fuse elements. The fuse module comprises: a branch-connection conductor having an input terminal adapted to be connected to the power supply and a plurality of fuse-connection terminals disposed correspondingly to the respective power input sections; a plurality of power-input conductors electrically connected to a corresponding one of the power input sections and each having a fuse-connection terminal disposed in a pair with a corresponding one of the fuse-connection terminals of the branch-connection conductor; and an insulation housing holding the branch-connection conductor and the power-input conductors. The insulation housing is formed with a plurality of fuse-installation portions for allowing the respective fuse elements to be detachably installed therein in such a manner that each of the fuse elements is connected to the fuse-connection terminal of the branch-connection conductor and the corresponding fuse-connection terminal of the power-input conductor, to be interposed between the fuse-connection terminals of the each pair.

According to the above fuse module, a power input from the power supply into the input terminal of the branch-connection conductor is diestibuted to the respective power input sections of the circuit assembly through the corresponding fuse elements and the corresponding fuse-connection terminals of the power-input conductors. If an overcurrent occurs in any circuit, a corresponding one of the fuse elements will be fused to protect the circuit. Better still, the fuse elements are installed into the fuse-installation portions formed in the common insulation housing, which enable concentrated management and easy replacement of the fuse elements.

That is, the present invention has an effect of distributing a power from a common power supply to the two or more power input sections while protecting the circuits with the fuse elements and enabling replacement and concentrated management of the fuse elements.

In the case where the circuit assembly has a plurality of bus bars including a plurality of input bus bars corresponding to the power input sections and the bus bars are arranged to form a power circuit, each of the input bus bars may have an end which is formed with the fuse-connection terminal and held in the insulation housing to serve as the power-input conductor. These input bus bars can be additionally used as the power-input conductors to reduce the number of components and enhance reliability in connection.

On the other hand, each of the power-input conductors may have an electric-connection portion protruding outside the insulation housing to be electrically connected to a corresponding one of the power input sections of the circuit assembly, which makes it possible to construct the fuse module independently of the circuit assembly.

In this fuse module, each of the power-input conductors may be provided with a press-fit portion as the electric-connection portion, the press-fit portion adapted to be press-fitted into a through-hole formed in a corresponding one of the power input sections to be electrically connected to the power input section, which enables an interconnection between the power-input conductor and the power input section in a simplified structure without the need for soldering or the like.

The conductors and the fuse-installation portions may be formed in any suitable shape and arranged in any suitable pattern. Preferably, the plurality of fuse-installation portions formed in the insulation housing are arranged along a direction orthogonal to an aligning direction of the fuse-connection terminals of the pair in each of the fuse-installation portions, and the branch-connection conductor extends along an direction in which the pairs of the fuse-connection terminals are arranged. In this case, both the fuse-installation portions and the branch-connection portions can be disposed along a specific direction to reduce the entire height dimension (that is a size in a direction orthogonal to the specific direction) of the module.

In the present invention, the fuse module may include any suitable conductor other than the branch-connection conductor and the power-input conductor.

For example, the fuse module may include a power-connection conductor having an input terminal adapted to be connected to an additional power supply other than the power supply to be connected to the input terminal of the branch-connection conductor, and a fuse-connection terminal. In this fuse module, the insulation housing holds the power-connection conductor and a specific one of the power-input conductors associated with the power-connection conductor and adapted to be electrically connected to a specific one of the power input sections. The specific power-input conductor has an end formed with a fuse-connection terminal. The insulation housing is formed with a fuse-installation portion for allowing one of the fuse elements to be detachably installed therein in such a manner that the fuse element is connected to the fuse-connection terminal of the power-connection conductor and the fuse-connection terminal of the specific power-input conductor, and interposed between the two fuse-connection terminals. This makes it possible to input a power to the circuit assembly through a different line from the branch-connection conductor.

In this case, the branch-connection conductor and the power-connection conductor may be disposed such that each of the fuse-connection terminals formed in the branch-connection conductor and the fuse-connection terminal formed in the power-connection conductor are aligned approximately in a line. This enables a power input through a plurality of lines with a small height dimension of the entire module.

The fuse module of the present invention may include an output conductor which is adapted to be connected to a power output section provided in the circuit assembly and has a fuse-connection terminal at an end, and an external-output conductor which has an external-output terminal and a fuse-connection terminal. In this fuse module, the insulation housing holds the output conductor and the external-output conductor, formed with a fuse-installation portion in which one of the fuse elements is detachably installed in such a manner that the fuse element is connected to the fuse-connection terminal of the output conductor and the fuse-connection terminal of the corresponding external-output conductor, to be interposed between the two fuse-connection terminals. This makes it possible to interpose the fuse element between the input terminal of the branch-connection conductor and each of the power input sections of the circuit assembly, and further to output a power from the power output section of the circuit assembly to an external circuit through the fuse element and the external-output conductor. Better still, the fuse elements are installed into the respective fuse-installation portions formed in the common insulation housing, which enable concentrated management of the fuse elements interposed between the power output section and the external-output conductor with the fuse elements interposed between the branch-connection conductor and the respective power input sections.

In this fuse module, when the circuit assembly has a plurality of bus bars including an output bus bar corresponding to the power output section, and the bus bars are arranged to form a power circuit, the output bus bar may have an end which is formed with the fuse-connection terminal and directly held within the insulation housing to serve as the power-output conductor. In this case, the output bus bars can be additionally used as the power-output conductors to reduce the number of components and enhance reliability in connection. Otherwise, the power-output conductor may have an electric-connection portion which is formed to protrude outside the insulation housing, and electrically connected to the power output section of the circuit assembly, which makes it possible to construct the fuse module independently of the circuit assembly.

The branch-connection conductor may include not only the fuse-connection terminals, but also a direct-connection portion adapted to be electrically connected directly to a specific one of the power input sections in the circuit assembly without interposition of the fuse element. This enables both a power input through the fuse elements and a direct power input without interposition of the fuse element into the circuit assembly, with the common branch-connection conductor.

In a specific embodiment, the branch-connection conductor may include an inter-terminal portion extending in a direction parallel to an arranging direction of the fuse-installation portions in the insulation housing so as to pass through between the fuse-connection terminals of the pair disposed at a specific one of the fuse-installation portions of the insulation housing, the direct-connection portion extending from the inter-terminal portion toward the specific power input section. This allows the branch-connection bus bar to extend in a direction parallel to the arranging direction of the fuse-installation portions in the insulation housing with effective utilization of a space between the fuse-connection terminals of the pair, and enables a direct power input from the inter-terminal portion disposed between the fuse-connection terminals of the pair to the circuit assembly through the direct-connection portion without interposition of the fuse element. Thus, even if the power input sections of the circuit assembly are located at spaced-apart positions between which the output conductor and the external-output conductor exist, a power can be input from the branch-connection conductor to each of the power input sections.

The present invention provides also a fuse module-equipped circuit assembly comprising the above fuse module, and a circuit assembly having a plurality of power input sections, each of the power-input conductors of the fuse module electrically connected to a corresponding one of the power input sections.

This circuit assembly enables a power distribution from a common power supply to a plurality of the power input sections through the fuse elements, in a simple structure where the fuse module is simply attached to the circuit assembly.

In the fuse module-equipped circuit assembly, the circuit assembly may include a current-detection bus bar with an input terminal and an output terminal between which a detection-target current is allowed to flow, at least one of the input terminal and output terminals held in the insulation housing. The incorporation of the current-detection bus bar in the circuit assembly add a current-detection function to the circuit assembly, while at least one of the input and output terminals of the current-detection bus bar being held in a simple structure with utilization of the insulation housing.

Further, the insulation housing may hold the output terminal of the current-detection bus bar and the input terminal of the branch-connection conductor in a state that the output terminal and the input terminal are superimposed on each other. This structure enables electrical interconnection between the output terminal of the current-detection bus bar and the input terminal of the branch-connection conductor, which allows a power distribution circuit comprising the fuse module and the circuit assembly to be connected to a downstream side of the current-detection bus bar.

The present invention further provides a structure for mounting the above fuse module to a vehicle, wherein the input terminal of the branch-connection conductor is fixed to a vehicle-mounted device or a vehicle body, while superimposed on a circuit-connection bus bar for connecting a power supply connected to the input terminal to another vehicle-mounted circuit.

The mounting structure realizes both an connection of the input terminal of the fuse module simultaneously only with fasting the input terminal of the branch-connection conductor to a vehicle-mounted device or a vehicle body in a state that the input terminal is superimposed onto the external-circuit-connection bus bar.

BRIEF DESCRIPTION OF DRAWINGS

FIG. 3 is a front view showing a bus bar layer formed by processing the metal plate having the shape illustrated in FIG. 2.

FIG. 6A is a sectional view take along the line A-A in FIG. 5B; FIG. 6B is a sectional view take along the line B-B in FIG 5B; and FIG. 6C is a sectional view take along the line C-C in FIG. 5B.

FIG. 11A is a front view of an insulation housing of a fuse module included in the power distributor illustrated in FIG. 8, and FIG. 11B is a bottom view of the insulation housing.

FIG. 13A is a sectional view take along the line E-E in FIG. 12B; FIG. 13B is a sectional view take along the line F-F in FIG. 12B; and FIG. 13C is a sectional view take along the line G-G in FIG. 12B.

DETAIL DESCRIPTION OF THE PREFERRED EMBODIMENTS OF THE INVENTION

A preferred embodiment of the present invention will be described based on the drawings. In this embodiment, there is attached a fuse module 50 illustrated in FIG. 7 to a circuit assembly with an array of bus bars illustrated in FIGS. 2 to 4 to construct a power distributor illustrated in FIGS. 5 and 6.

Figure 1:
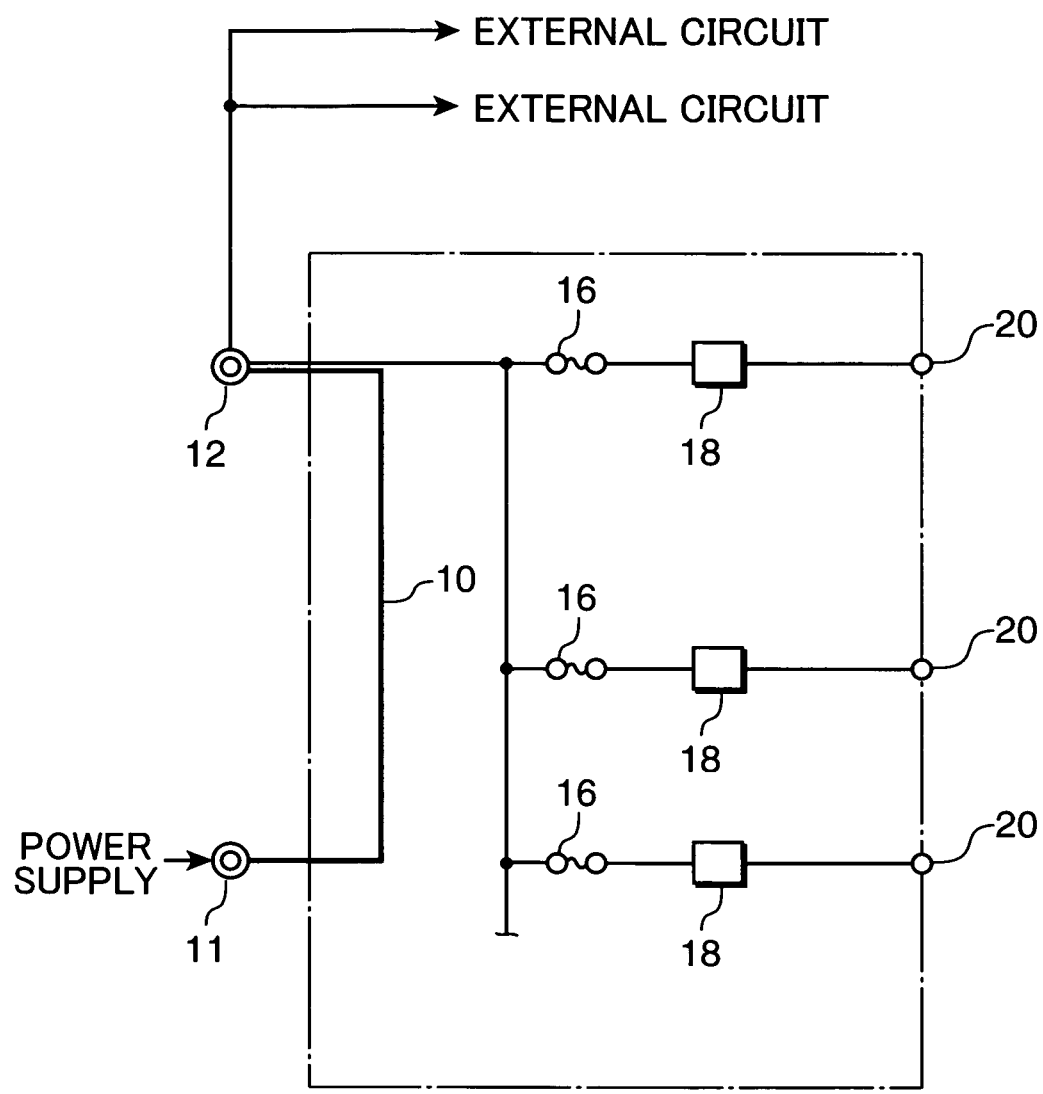
FIG. 1 is a circuit diagram showing the configuration of a major portion of a power circuit included in a circuit assembly according to an embodiment of the present invention.

FIG. 1 is a circuit diagram showing the configuration of a major portion of a power circuit formed in the circuit assembly. This circuit assembly includes a current-detection bus bar 10 constituting a current sensor which will be described in detail later. The current-detection bus bar 10 has an input terminal 11 to be connected to an unillustrated vehicle-mounted power supply (that is alternator in this embodiment), and an output terminal 12. The output terminal 12 of the current-detection bus bar 10 has a branching connection to a plurality of output terminals 20, and a fuse element 16 and a switching element 18 are interposed between the output terminal 12 and each of the output terminals 20.

As the switching element 18 is preferably used a mechanical relay switch or a semiconductor element such as a FET.

Figure 2:
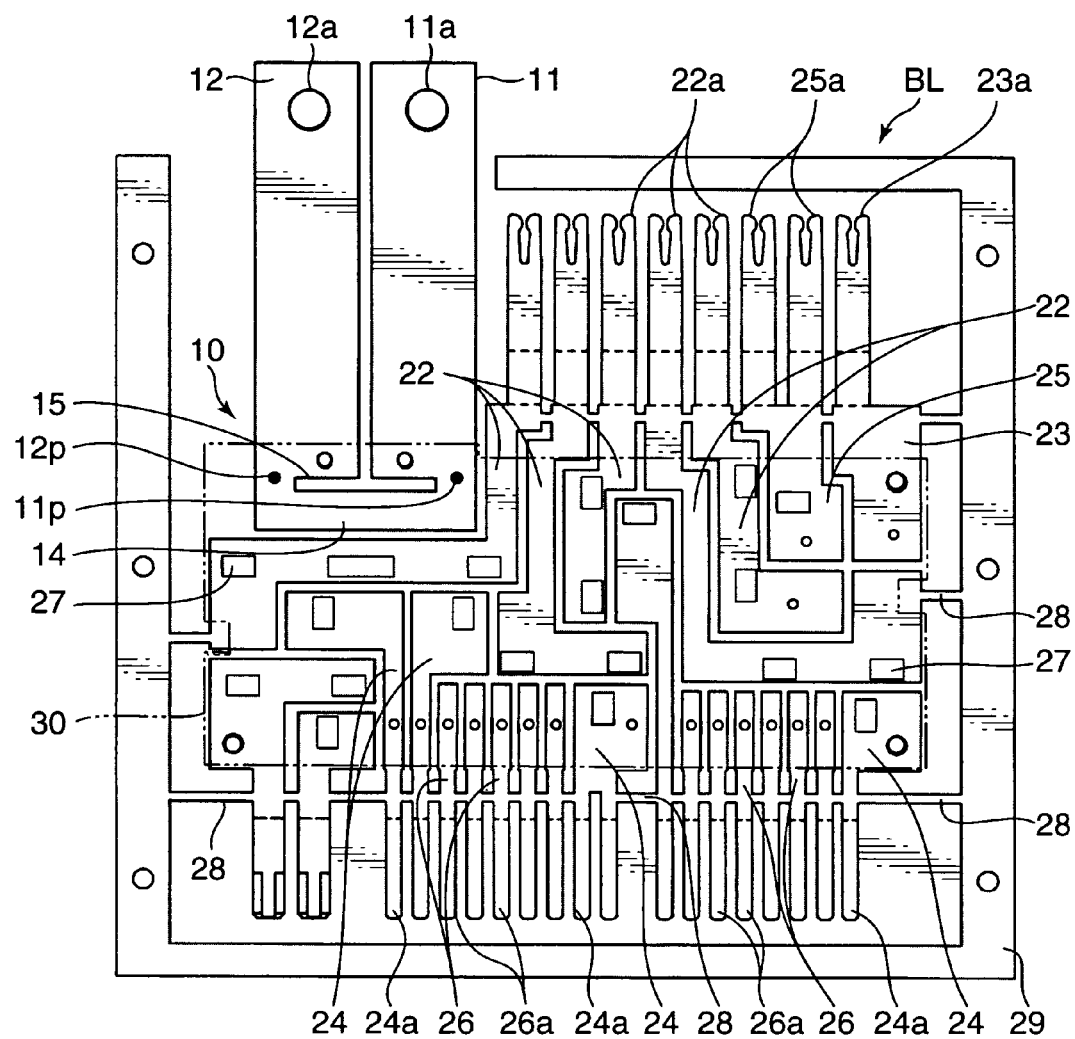
FIG. 2 is a front view showing a metal plate punched into a shape corresponding to power-circuit-forming bus bars to be included in the circuit assembly, and a current-detection bus bar arranged therewith.

In this embodiment, there are produced a plurality of power-circuit-forming bus bars for forming the power circuit by punching a single metal plate into a shape as shown in FIG 2. These power-circuit-forming bus bars and the current-detection bus bar 10 are arranged approximately flush with each other to make up a bus bar layer BL. This bus bar layer BL is directly bonded to a circuit board 30 indicated by the two-dot chain line in FIG. 2 through an insulating layer consisting of a coating-type adhesive or an adhesive sheet, and an appropriate region of the bus bar layer BL is cut off and bent to produce a major portion of the circuit assembly having both the current sensor and the power circuit in a significantly thin and simple structure as shown in FIGS. 3A and 3B.

Figure 4A:
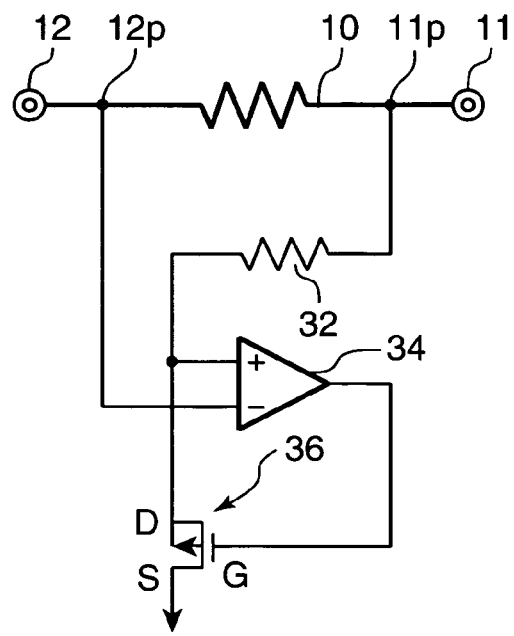
FIG. 4A is a circuit diagram of a detection circuit of a current censor to be incorporated in the circuit assembly.
Figure 4B:
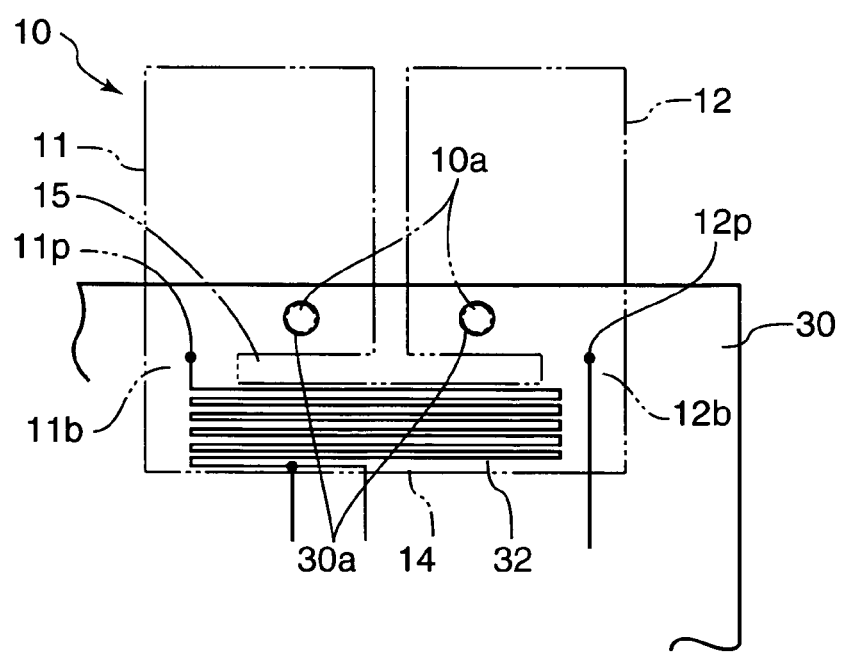
FIG. 4B is a back view showing a specific configuration of the sensor.

In this circuit assembly, the configuration of the current sensor including the current-detection bus bar 10 will be firstly described based on FIGS. 4A and 4B. FIG. 4A shows a detection circuit of the current sensor. This detection circuit includes a plurality of circuit elements such as a resistor 32, a comparator circuit 34, an FET 36, etc., and these circuit elements are mounted on the circuit board 30.

On the current-detection bus bar 10 are located two measurement points 11$p$, 12$p$, between which a current path having a given current-detection resistor is formed. Each of the measurement points 11$p$, 12$p$ is electrically connected to the circuit board 30. Among the measurement points 11$p$, 12$p$, the measurement point 1ip, located closer to the input terminal 11, is connected to a first input terminal of the comparator circuit 34 through the resistor 32, and further connected to a drain of the FET 36. The measurement point 12$p$, located closer to the output terminal 12, is connected directly to a second input terminal of the comparator circuit 34. The comparator circuit 34 is operable to output a potential difference between respective signals input into the first and second input terminals of the comparator circuit 34, i.e. a signal representing a voltage drop between the measurement points 11$p$, 12$p$. This output signal is input into a gate of the FET 36 to allow a drain-source current of the FET 36 to flow at a value corresponding to that of the voltage drop.

FIG. 4B shows a specific structure of the current sensor.

The current-detection bus bar 10 is formed of a single metal plate. The input terminal 11 and the output terminal 12 of the current-detection bus bar 10 are each formed in a rectangular shape, and arranged in spaced-apart and adjacent relation to each other in a direction parallel to a width direction of the rectangular shape, respective proximal ends of the input terminal 11 and the output terminal 12 being connected together through a connection portion 14 extending in the arranging direction of the terminals 11, 12.

More specifically, an outside portion of the input terminal 11 is connected to one end of the connection portion 14 through a joint portion 11b narrower than the input terminal 11, and an outside portion of the output terminal 12 is connected to the other end of the connection portion 14 through a joint portion 12b narrower than the output terminal 12. Further, respective distal ends of the input terminals 11, 12 are bent approximately at a right angle in the same orientation, and formed with bolt insertion holes 11a, 12a, respectively.

The current-detection bus bar 10 of the above shape can be readily produced, for example, by forming an inverted T-shaped slit 15 as illustrated in FIG. 4B in a rectangular metal plate, and bending input terminals 11, 12 separated by the formed slit 15, in the same orientation.

This current-detection bus bar 10 may be bonded to the circuit board in such a manner that at least the connection portion 14 of the current-detection bus bar 10 is superimposed onto the circuit board 30 and at least a part of the input terminals 11, 12 protrudes beyond an edge of the circuit board 30, which gives a structure capable of easy interconnection between each of the terminals 11, 12 and an external circuit.

In this embodiment, the measurement points 11p, 12p in the current-detection bus bar 10 are located on the joint portions 11b, 12b respectively or at positions adjacent thereto, and electrically connected to the circuit board 30. Further, a conductor pattern constituting the current sensor on the circuit board 30 (that is a meandering pattern making up the resistor 32 in FIG. 4B) e is disposed so as to be superimposed with the connection portion 14.

Incidentally, the circuit assembly according to the present invention does not necessarily require the current-detection bus bar 10; the present invention is applicable to a circuit assembly connectable with an after-mentioned fuse module 50.

Secondly, the following description will be made about the power-circuit-forming bus bars constituting the bus bar layer BL of the circuit assembly together with the current-detection bus bar 10.

The power-circuit-forming bus bars include a plurality of input bus bars 22, an input bus bar 23, a plurality of output bus bars 24, 25, and further a plurality of signal input/output bus bars 26 arranged therein.

Each of the input bus bars 22 is designed to be connected to the output terminal 12 of the current-detection bus bar 10 through the after-mentioned fuse module 50 and the fuse element 16. Each of the input bus bars 22 has one end bent at two positions to form a step, and a tip of the end is formed as a fork-shaped fuse-connection terminal 22a into which a terminal of the fuse element 16 can be press-fitted. The input bus bars 22 are arranged such that the fuse-connection terminals 22a are aligned in a line.

The input bus bar 23 is designed to be connected to a vehicle-mounted power supply (a battery in this embodiment) other than the alternator, through the after-mentioned fuse module 50 and the fuse element 16. The input bus bar 23 has an end bent at two positions in the same manner as the end of the input bus bar 22, and a tip of the end is formed as a fork-shaped fuse-connection terminal 23a in the same manner as the fuse-connection terminal 22a. The input bus bar 23 is arranged such that the fuse-connection terminal 23a is aligned in a line with the fuse-connection terminals 22a.

Each of the output bus bars 24, 25 is arranged such that an appropriate region thereof is adjacent to an appropriate region of a specific one of the input bus bars 22. Each of the switching elements 18 is disposed to bridge between the adjacent pair of the input bus bar 22 and the output bus bar 24 or 25, and electrically connected to the circuit board 30. For mounting the switching elements 18 is preferably used the following process, for example.

1) A plurality of solder patterns 27 as shown in FIG. 2 are printed in appropriate regions of the bus bars 22, 24, 25, and corresponding to the respective solder patterns 27 a plurality of through-holes are formed in the circuit board 30.

2) Through a corresponding one of the through-holes is placed a lead 18a of each of the switching elements 18 on an associated one of the solder patterns 27, and the solder pattern 27 is molten to form a fillet so as to electrically connect the lead 18a to an associated one of the bus bars 22, 24, 25. On the other hand, a part of the lead 18a is soldered and mounted directly to a conductor pattern on the circuit board 30.

In the circuit board 30, in addition to the detection circuit of the current sensor, a control circuit for on-off controlling the switching elements 18 is built. The control circuit outputs a control signal which performs an on-off control of the switching elements 18, i.e. a control of an electrical continuity between each of the input bus bars 22 and a corresponding one of the output bus bars 24, 25.

Among the output bus bars 24, 25, each of the output bus bars 24 has an end bent at a right angle, and a tip of the end is formed as a tab terminal 24a constituting the aforementioned output terminal 20 illustrated in FIG. 1. The output bus bars 24 are arranged such that the tab terminals 24a protrude in an opposite direction relative to the fuse-connection terminals 22a. On the other hand, the output bus bar 25 has an end bent at two positions in the same manner as each of the ends of the input bus bars 22, 23, and a tip of the end of the output bus bar 25 is formed as a fork-shaped fuse-connection terminal 25a in the same manner as each of the fuse-connection terminals 22a, 23a. The output bus bar 25 is arranged such that the fuse-connection terminals 25a are aligned in a line with the fuse-connection terminals 22a, 23a.

Each of the signal input/output bus bars 26 is for interconnecting a circuit built in the circuit board 30 and an external circuit. Each of the output bus bars 26 has an end bent at a right angle, and a tip of the end is formed as a tab terminal 26a. The signal input/output bus bars 26 are arranged such that the tab terminals 26a are aligned in a line with the tab terminals 24a.

Appropriate regions of the respective bus bars 22 to 26 has a direct connection to a circuit built in the circuit board 30 through through-holes or the like, in the same manner as the measurement points 11p, 12p in the current-detection bus bar 10. In the above circuit assembly, there is fixed a heat-dissipation member 40 as shown in FIG. 6 onto one surface of the bus bar layer BL (a second surface on the opposite side of a first surface bonded onto the circuit board 30). Further, attached are an insulation cover 46, a fuse module 50 according to the present invention, and a connector housing 58 to the heat-dissipation member 40, thus constructing a final product as the power distributor illustrated in FIGS. 5 and 6.

Figure 5A:
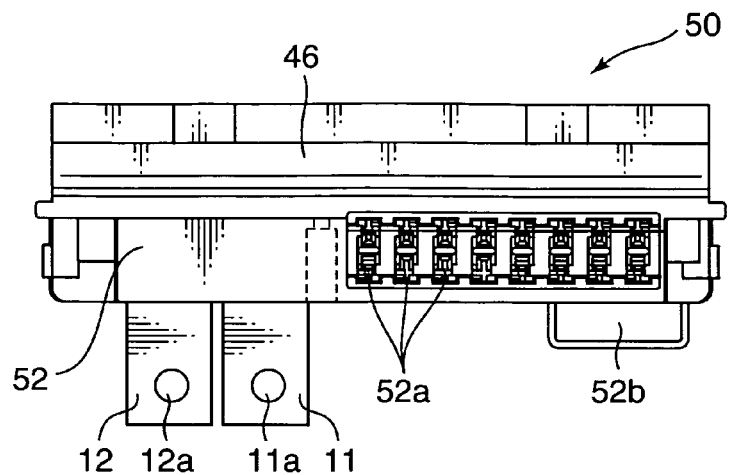
FIG. 5A is a top plan view of a power distributor comprising the circuit assembly and a fuse module incorporated therein.
Figure 5B:
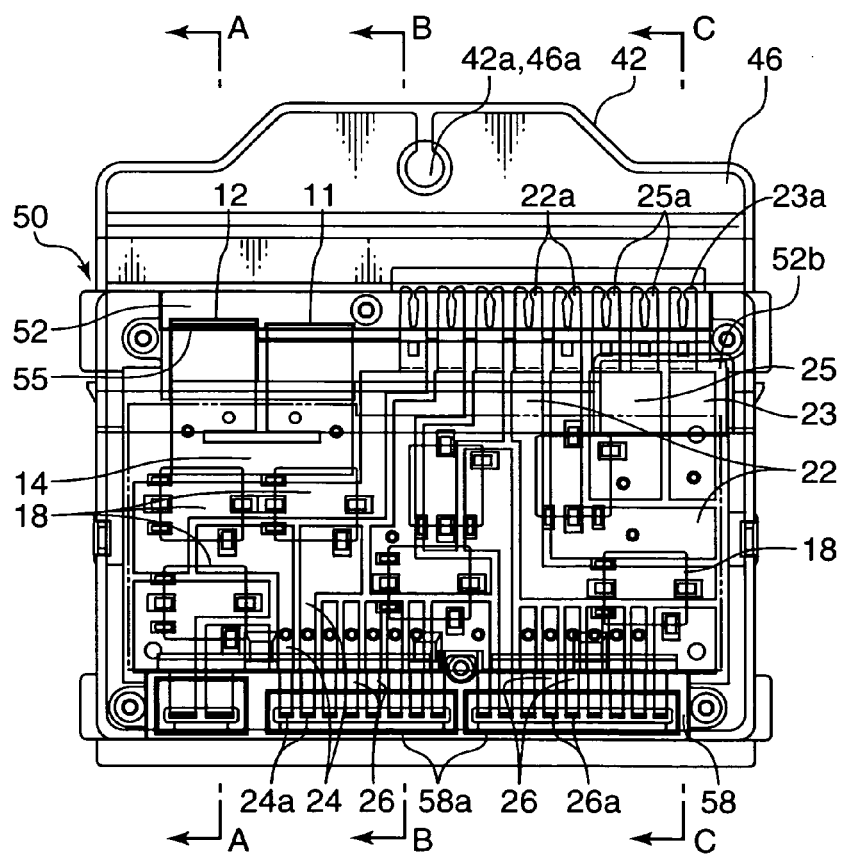
FIG. 5B is a front view of the power distributor.

In FIG. 5B, all components overlapping each other are illustrated by solid lines for the sake of simplicity.

The heat-dissipation member 40 is, in this embodiment, formed in a plate-like shape from a metal material with high thermal conductivity, such as aluminum. One surface of the heat-dissipation member 40 serves as a flat bonding surface, on which the bus bar layer BL is bonded through the medium of an adhesive layer. This adhesive layer is preferably made of a material excellent in insulating performance and thermal conductivity, for example, a material prepared by mixing filler such as alumina into a base material consisting of an epoxy resin or the like.

From an upper end of heat-dissipation member 40 extends a mounting portion 42 obliquely upward, an appropriate step provided between the mounting portion 42 and a main body of the heat-dissipation member 40. The mounting portion 42 is formed with a bolt-insertion hole 42a penetrating the mounting portion 42 in a through-thickness direction.

The insulation cover 46 is disposed to cover the mounting portion 42 from one side (the same side as that of the bus bar layer BL), and also formed with a bolt-insertion hole 46a. A bolt is inserted through both the bolt-insertion holes 42a, 46a, and fastened to a vehicle body for example, thus fixing the heat-dissipation member 40 to the body to allow heat held in the heat-dissipation member 40 to be released toward the body by thermal conduction.

The fuse module 50 has an insulation housing 52 as shown in FIGS. 5 to 7. In the insulation housing 52 is held the input and output terminals 11, 12 of the current-detection bus bar 10, a branch-connection bus bar (branch-connection conductor) 54 formed of a metal plate, a plurality of external-output conductors 56, a power-connection conductor 53, and further the ends of the input bus bars 22, 23 and the output bus bar 25 (the ends on the side of the fuse-connection terminals 22a, 23a, 25a) in the bus bar layer BL, the ends introduced into the insulation housing 52 as power-input conductors and output conductors.

This insulation housing 52 is formed with a plurality of fuse-installation portions 52a in each the fuse element 16 can be attached, the fuse-installation portions 52a arranged along a direction parallel to the arranging direction of the fuse-connection terminals 22a, 23a, 25a of the input bus bars 22, 23 and the output bus bar 25.

The branch-connection bus bar 54 held in the insulation housing 52 is for branching connection of the output terminal 12 of the current-detection bus bar 10 to the respective input bus bars 22 of the bus bar layer BL through the respective fuse elements 16. The external-output conductors 56 are for connections of the output bus bar 25 to an external circuit through the corresponding fuse elements 16. The power-connection conductor 53 is for connection of the input bus bar 23 to the battery, a vehicle-mounted power supply, through the corresponding fuse element 16.

More specifically, the branch-connection bus bar 54 extends in a direction parallel to the arranging direction of the fuse-connection terminals 22a, i.e. a direction parallel to the arranging direction of the fuse-installation portions 52 (rightward/leftward direction in FIGS. 5 and 7). One end of the branch-connection bus bar 54 is formed as a branch-connection input terminal 55 protruding in a direction orthogonal to a longitudinal direction of the bus bar 54. This branch-connection input terminal 55, which is held in the insulation housing 52 in superimposed relation with the output terminal 12 of the current-detection bus bar 10, is formed with a bolt-insertion hole 55a aligned with the bolt-insertion hole 12a of the output terminal 12.

Each of the output terminal 12 and the branch-connection input terminal 55 protrudes outside the insulation housing 52 through a terminal-insertion groove 52d provided in the insulation housing 52. In a state that the terminals 12, 55 are superimposed on external-circuit-connection bus bars 64, 66, a bolt 60 as shown in FIG. 6A is inserted into bolt-insertion holes formed in the respective bus bars (that is the bolt-insertion holes 12a, 55a in the output terminal 12 and the branch-connection input terminal 55), and driven into a screw hole formed in a case 62 of an electric connection box installing the power distributor (or in the vehicle body), thus achieving a fixation of the power distributor and a connection between the superimposed output terminal 12/branch-connection input terminal 55 and an external circuit, simultaneously.

The insulation housing 52 is formed with also a terminal-insertion groove 52c for allowing the input terminal 11 of the current-detection bus bar 10 to extend outside. The input terminal 11 is connected to a power-connection bus bar through a bolt inserted into the bolt-insertion hole 11a of the input terminal 11.

The other end of the branch-connection bus bar 54 is formed as a plurality of fork-shaped fuse-connection terminals 54a corresponding to the fuse-connection terminals 22a of the input bus bars 22 respectively. Each of the fuse-connection terminals 54a is disposed at a position opposed to a corresponding one of the fuse-connection terminals 22a. Pairs of the fuse-connection terminals 22a, 54a are located in an appropriate one of the fuse-installation portions 52a while aligned in a direction orthogonal to the arranging direction of the fuse-installation portions 52a. Thus, when a fuse element 16 as shown in FIGS. 6B and 6C is inserted into the fuse-installation portion 52a, a terminal pair 16a of the fuse element 16 is fitted with the fuse-connection terminals 22a, 54a, sandwiched therebetween. This fitting engagement establish an electrical connection between the terminal pair 16a and the terminals 22a, 54a, which interposes the fuse element 16 between the branch-connection bus bar 54 and a corresponding one of the input bus bars 22.

On the other hand, external-output conductors 56 are disposed corresponding to the output bus bar 25 in the bus bar layer BL. One end of each of the external-output conductors 56 is formed as a fork-shaped fuse-connection terminal 56a corresponding to each of the fuse-connection terminals 25a of the output bus bar 25, each of the fuse-connection terminals 56a disposed at a position opposed to a corresponding one of the fuse-connection terminals 25a.

Similarly, the power-connection conductor 53 is disposed corresponding to the input bus bar 23 of the bus bar layer BL. One end of the power-connection conductor 53 is formed as a fork-shaped fuse-connection terminal 53a corresponding to the fuse-connection terminal 23a of the input bus bar 23 respectively. The fuse-connection terminal 53a is disposed at a position opposed to the fuse-connection terminal 23a.

These conductors are held in the insulation housing 52 in such a manner that the paired fuse-connection terminals 25a, 56a, aligned in a direction orthogonal to the arranging direction of the fuse-installation portions 52a, are located in an appropriate one of the fuse-installation portions 52a, and that the similarly paired fuse-connection terminals 23a, 53a, aligned in a direction orthogonal to the arranging direction of the fuse-installation portions 52a, are located in an appropriate one of the fuse-installation portions 52a. Thus, when the fuse element 16 is inserted into each of the fuse-installation portions 52a, the terminal pair 16a of the fuse element 16 is fitted with the fuse-connection terminals 25a, 56a, sandwiched between or fitted with the fuse-connection terminals 23a, 53a. These fitting engagements establish interposition of the fuse elements 16 between the output bus bar 25 and each of the external-output conductors 56, and between the power-connection conductor 53 and the input bus bar 23, respectively.

The other end of each of the external-output conductors 56 is formed as a tab terminal 56b which is an external-output terminal, and the other end of the power-connection conductor 53 is formed as a tab terminal 53b which is a power-connection terminal. All of the tab terminals 56b, 53b are disposed to protrude in the same orientation (downward in the illustrated embodiment). The insulation housing 52 is formed with a hood 52b which covers the tab terminals 56b, 53b from the lateral side thereof and has a downward opening. When a connector led from an external circuit is inserted into the hood 52b, terminals of the connector are fitted into the tab terminals 56b, 53b. The fitting engagements establish a connection of each of the external-output conductors 56 to the external circuit, and a connection of the power-connection conductor 53 to the battery.

The connector housing 58 has a hood 58a of a shape covering the tab terminals 24a, 26a of the output bus bars 24 and the signal input/output bus bars 26 of the bus bar layer BL, and having a lateral opening. When a connector led from an external circuit is inserted into the hood 58a, terminals of the connector are fitted into the tab terminals 24a, 26a to connect the output bus bars 24 and the signal input/output bus bars 26 to the external circuit.

An operation of this circuit assembly will be described below.

In response to input of a power (a power from the alternator) into the input terminal 11 of the current-detection bus bar 10, there flows a current from the input terminal 11 to the output terminal 12 through the connection portion 14, introducing a voltage drop between the measurement points 11p, 12p of the bus bar 10. This voltage drop is detected by the detection circuit of the circuit board 30 connected to the measurement points 11p, 12p, and a value of the current flowing between the measurement points 11p, 12p is calculated based on the voltage drop. A resulting detection signal is input into a control unit (not shown). When the current value exceeds a predetermined allowable value, a current-carrying in the control unit will be stopped by turning off the switching elements 18 and so on, thus the power unit protected from an overcurrent. While this current causes heat generation in the current-detection bus bar 10, the heat is effectively released to the vehicle body through the heat-dissipation member 40 bonded to the current-detection bus bar 10.

The current which has flowed into the output terminal 12 is supplied to an external circuit through the external-circuit-connection bus bars 64, 66 connected to the output terminal 12, while flowing into the input terminal 55 of the branch-connection bus bar 54 superimposed on the output terminal 12 and being distributed from the respective fuse- connection terminals 54a of the branch-connection bus bar 54 to the respective fuse- connection terminals 22a of the input bus bars 22 through the corresponding fuse elements 16. The current which has flowed into the input bus bars 22 further flows into the respective output bus bars 24, 25 through the corresponding switching elements 18, and is output from the tab terminals 24a of the output bus bars 24 to an external circuit through a connector fitted in the tab terminals 24a. The current is further output from the circuit assembly to an external circuit also through the fuse-connection terminals 25a of the output bus bar 25, the fuse elements 16, the external-output conductors 56, and a connector fitted into the external-output conductors 56. On the other hand, from the buttery which is an additional power supply other than the alternator, a power is input also into the input bus bar 23 through the power-input terminal 53a and the fuse element 16, and introduced into the power circuit.

In the above configuration, a power which is input from the alternator into the input terminal 55 of the branch-connection bus bar 54 through the current-detection bus bar 10 is distributed to the respective input bus bars 22 through the corresponding fuse elements 16. Further, when an overcurrent occurs in either one of the branch circuits, a corresponding one of the fuse elements 16 will be fused to protect the branch circuit. In addition, all of the fuse-installation portions 52a are formed in the common insulation housing 52, which enable the concentrated management and easy replacement of the fuse elements 16.

The respective ends of the input bus bars 22, 23 and the output bus bar 25 in the circuit assembly are introduced into the insulation housing 52 to be additionally used as conductors which serve as components of the fuse module 50, thus reducing the number of components by that much, and enhancing reliability in connection.

In the illustrated structure, since a plurality of the fuse-installation portions 52a formed in the insulation housing 52 are arranged along a direction orthogonal to the opposed direction of the fuse-connection terminals of the pair in each of the fuse-installation portions 52a, and the branch-connection bus bar 54 extends along the arranging direction of the fuse-installation portions 52a, both the branch-connection bus bar 54 and the group of fuse-installation portions 52a can be disposed along a specific direction (rightward/leftward direction in FIG. 5) to reduce the entire height dimension (vertical dimension in FIG. 5B) of the module.

In the illustrated embodiment, the fuse module 50 comprises the power-connection conductor 53 in addition to the branch-connection bus bar 54, which enable a power input from an additional power supply (the battery in this embodiment) other than a power supply (the alternator in this embodiment) connected to the branch-connection bus bar 54 through a separate line. Further, since the fuse-connection terminals 54a formed in the branch-connection bus bar 54 and the fuse-connection terminal 53a formed in the power-connection conductor 53 are disposed to be aligned approximately in a line, a power input in a plurality of lines can be realized with a small height dimension of the entire module.

In the power distributor, in a simplified structure utilizing the insulation housing 52 of the fuse module 50, also the input terminal 11 and the output terminal 12 of the current-detection bus bar 10 is held. Further, the output terminal 12 and the input terminal 55 of the branch-connection bus bar 54 are held in the insulation housing 52 while superimposed on each other, which enables an interconnection between the terminals 12, 55 to connect a power distribution circuit by the fuse module 50 and the circuit assembly to a downstream side of the current-detection bus bar 10.

Figure 7A:
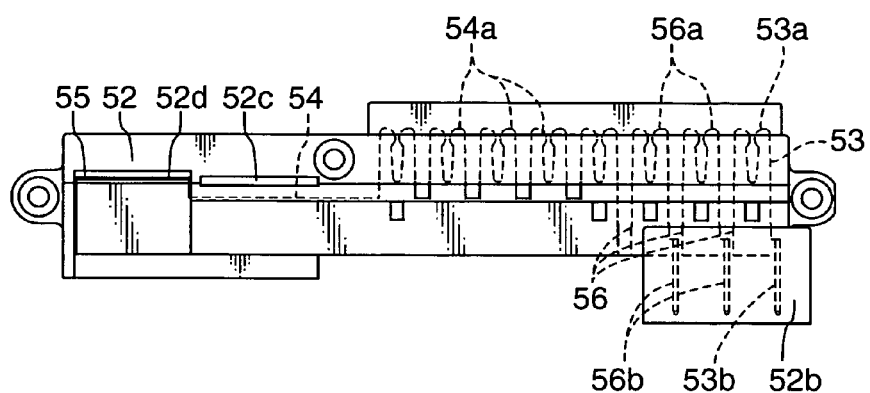
FIG. 7A is a front view of a fuse module included in the power distributor.
Figure 7B:
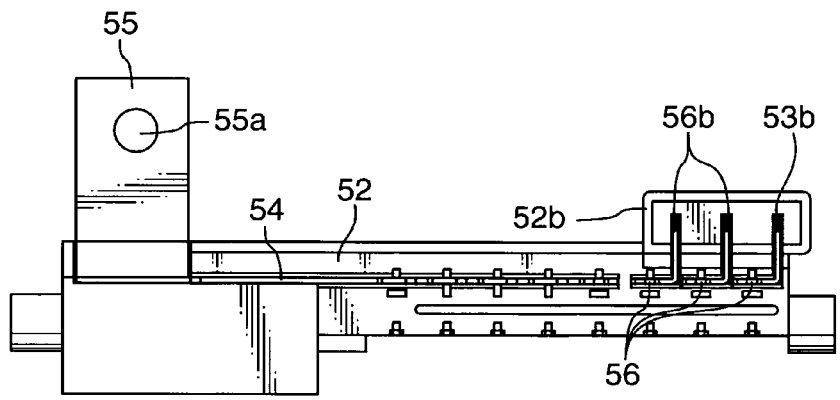
FIG. 7B is a bottom view of the fuse module.
Figure 8:
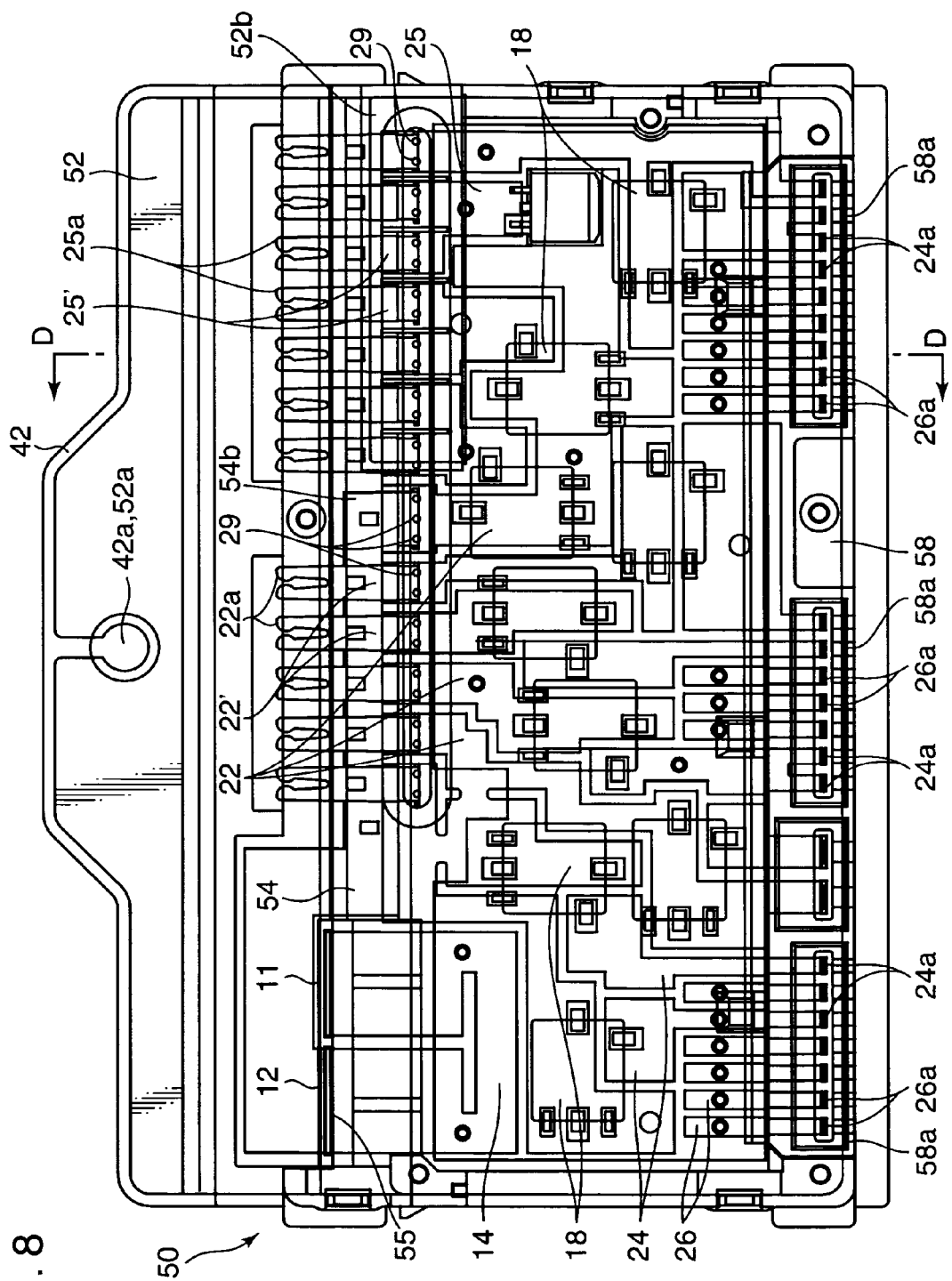
FIG. 8 is a front view showing a power distributor in which each conductor in a fuse module is constructed as a member separated from the circuit assembly.
Figure 9:
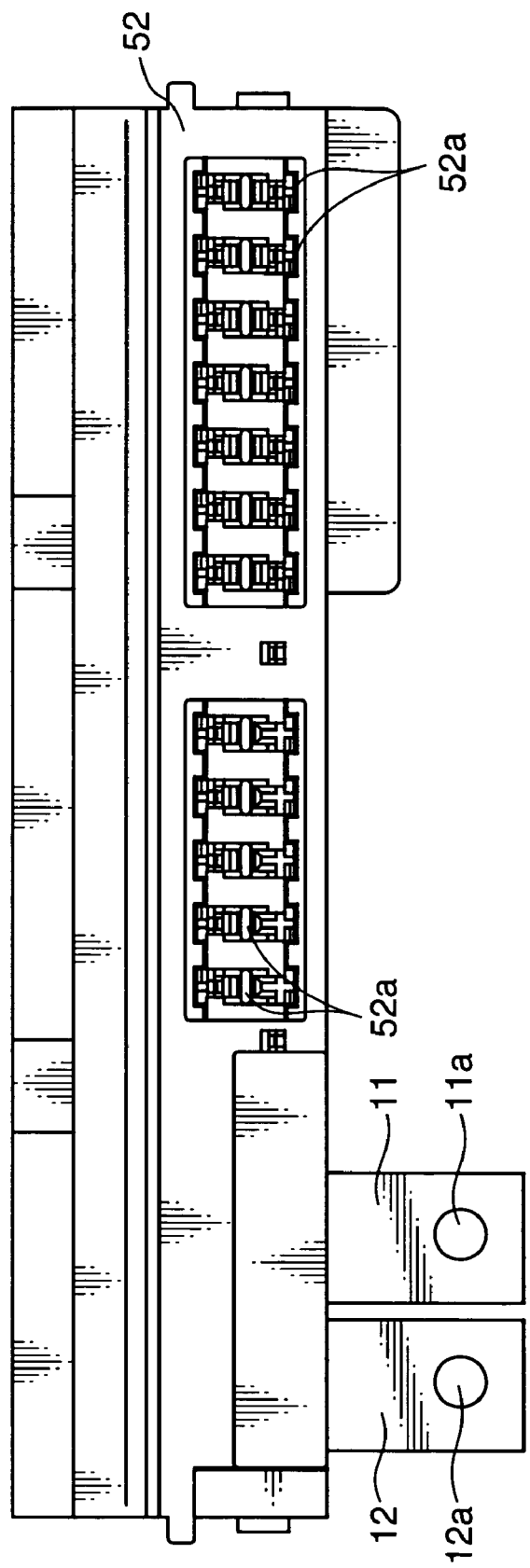
FIG. 9 is a top plan view of the power distributor illustrated in FIG. 8.
Figure 10:
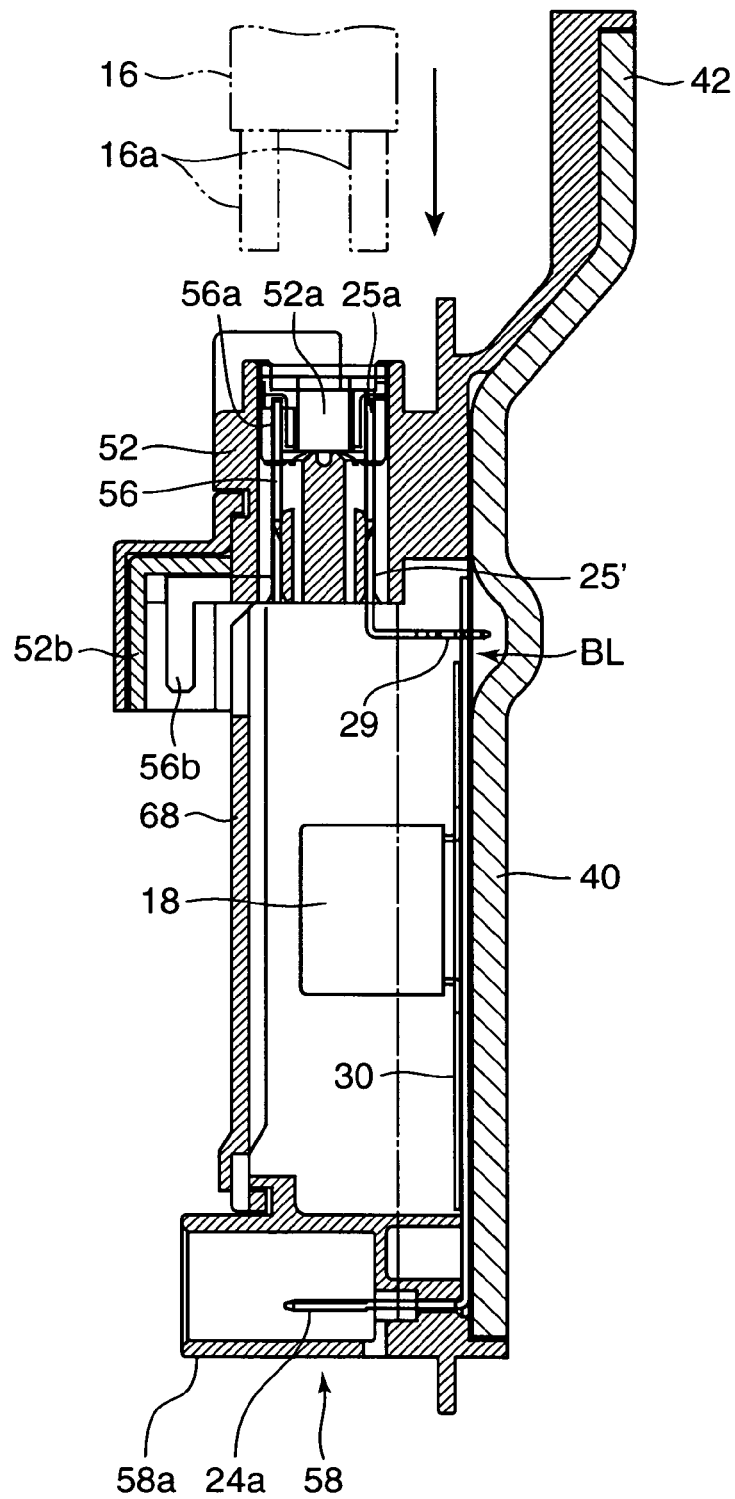
FIG. 10 is a sectional view taken along the line D-D in FIG. 8.

Although, in the fuse module 50 illustrated in FIGS. 5 to 7, the respective ends of the input bus bars 22, 23 and the output bus bar 25 on the side of the bus bar layer BL are introduced into the insulation housing 52 to be additionally used as power-input conductors and output conductors respectively, these power-input conductors and output conductors may be constructed independently of the bus bar layer BL One example of this case is shown in FIGS. 8 to 10.

In the illustrated embodiment, there are held a plurality of power-input conductors 22' and a plurality of output conductors 25' in the insulation housing 52 as different members from the input bus bars 22 and the output bus bar 25 included in the bus bar layer BL.

One ends of the conductors 22', 25', which are formed as fuse-connection terminals 22a, 25a identical to the fuse-connection terminals 22a, 25a illustrated in FIG. 2, respectively, are disposed in opposed relation to the fuse-connection terminals 54a of the branch-connection bus bar 54 and the fuse-connection terminals 56a of the external-output conductors 56, respectively. The other ends of the conductors 22', 25' are so formed as to protrude downward from a lower surface of the insulation housing 52, and bent toward the bus bar layer BL into an L shape. Each of the other ends is formed in a pin-like shape to make up a press-fit portion 29. These press-fit portions 29 are press-fitted into through-holes formed in the bus bars 22, 25 respectively to make electrical connections between the corresponding bus bars 22, 25, and the power-input conductors 22' and the output conductors 25'.

The structure for electrical interconnection of the conductors 22', 25' and the corresponding bus bars 22, 25 is not limited to the illustrated embodiment. For example, soldering may achieve the interconnection.

While FIGS. 11A and 11B are a front view and a bottom view of the fuse module 50 respectively, as with FIGS. 7A and 7B, FIGS. 11A and 11B shows only the insulation housing 52 of the fuse module unlike FIGS. 7A and 7B. Shown in FIG. 11B are a groove 52*e* into which the branch-connection bus bar 54 is inserted, and a groove 52*f* into which the external-output conductors 56 is inserted.

In this embodiment, there is further extending a direct connection portion 54*b* from one end (right end in FIG. 8) of the branch-connection bus bar 54 on the opposite side of the input terminal 55 directly to a specific one of the input bus bars 22 on the bus bar layer bypassing the fuse element 16. The direct connection portion 54*b* is also formed with the aforementioned pin-like press-fit portion 29, which is press-fitted into a through-hole of the input bus bar 22 to establish a direct connection of the bus bar 54 to the input bus bar 22.

The addition of the direct connection portion 54*b* to the branch-connection bus bar 54 makes it possible to build both a circuit for inputting a power into the input bus bars 22 through the fuse elements 16 and a circuit for inputting a power directly into the input bus bar 22 without interposition of the fuse element 16.

A certain circuit design may require an interposition of an additional connection conductor between the fuse-connection terminal 54*a* and the direct-connection portion 54*b* of the branch-connection bus bar 54 or between the direct-connection portions 54*b*. In this case, an adoption of a structure as shown in FIGS. 12 to 14, for example, enable a desirable arrangement of the fuse-connection terminal 54*a* and the direct-connection portion 54*b* with a small height dimension of the entire fuse module 50.

Figure 12A:
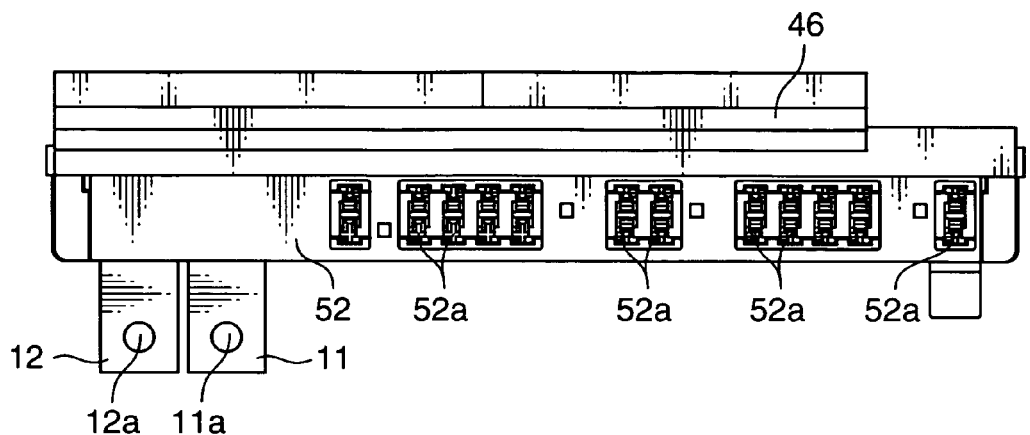
FIG. 12A is a top plan view showing a power distributor in which a part of a branch-connection bus bar in a fuse module extends to pass through between each pair of fuse-connection terminals.
Figure 12B:
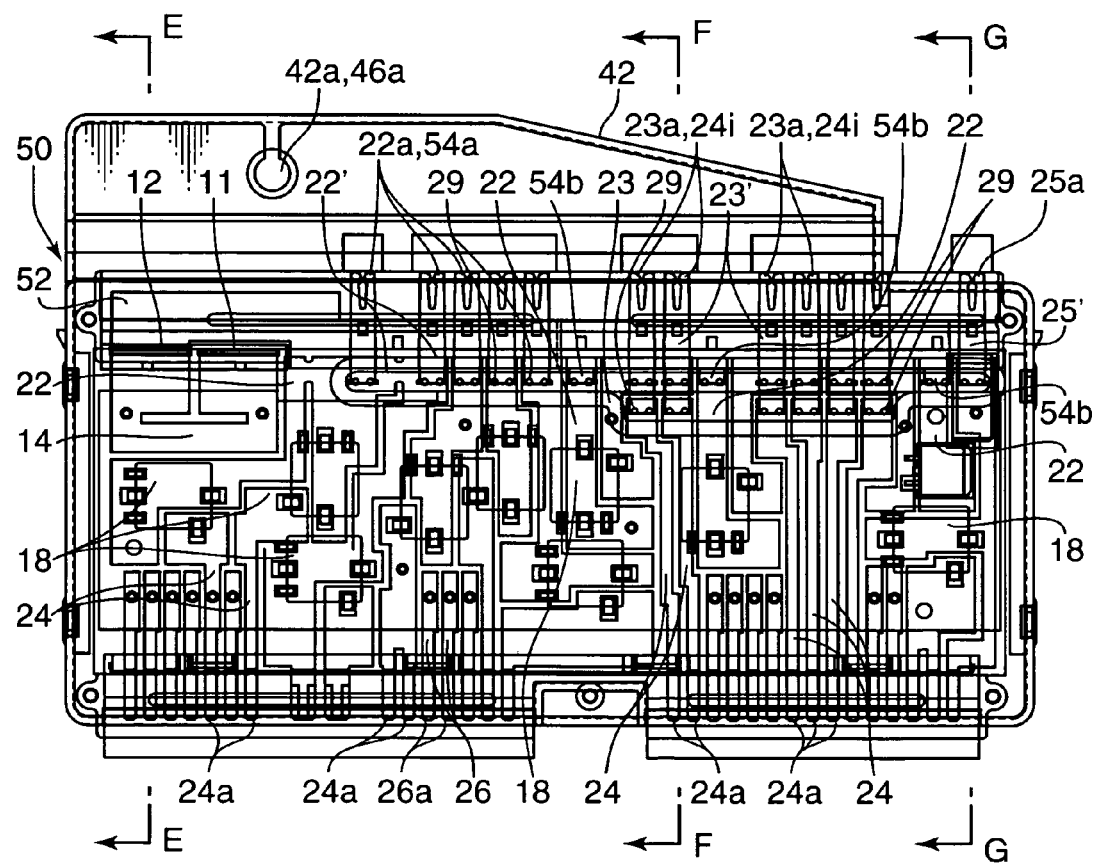
FIG. 12B is a front view of the power distributor.
Figure 14A:
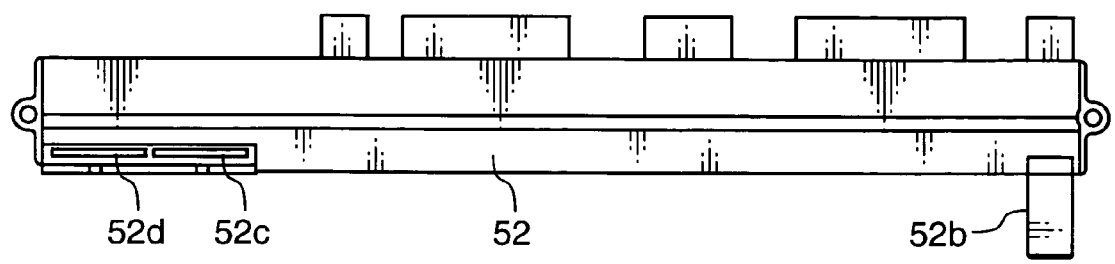
FIG. 14A is a front view of a fuse module included in the power distributor illustrated in FIG. 12.

In FIGS. 12 to 14, the branch-connection bus bar 54 has three direct-connection portions 54*b* in addition to the fuse-connection terminals 54*a*, and further between the direct-connection portions 54*b* are interposed a plurality of conductor pairs. As also shown in FIG. 13B, each of the conductor pairs consist of a fuse-input conductor 23' for introducing a power from the bus bar layer BL and inputting the power into one of the terminals 16*a* of the fuse element 16 installed in the fuse-installation portion 52*a*, and a fuse-output conductor 24' for outputting the power from the other terminal 16*a* of the fuse element 16 to the output bus bar 24 of the bus bar layer BL. The conductors 23', 24' are formed with fuse-connection terminals 23*a*, 24*i* respectively, which are located in respective fuse-installation portions 52*a*.

Figure 14B:
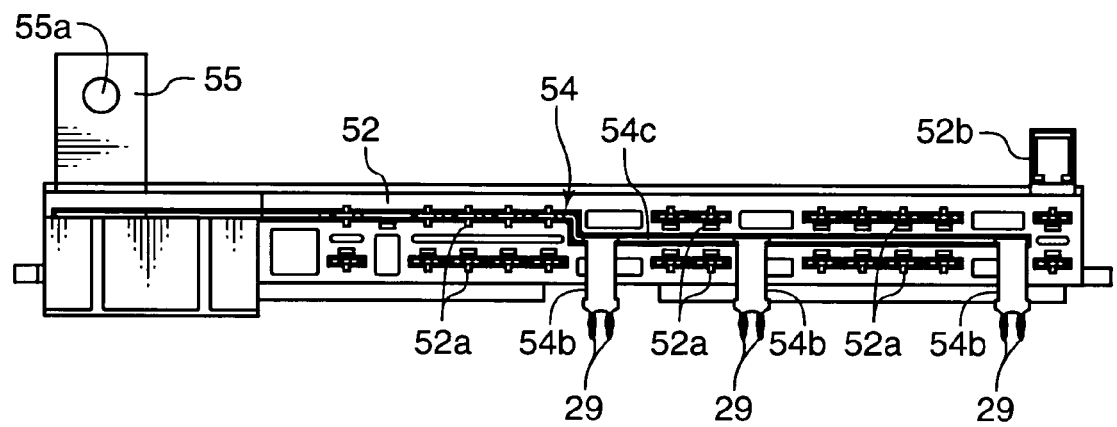
FIG. 14B is a bottom view of the fuse module.

On the other hand, the branch-connection bus bar 54 is, as shown in FIG. 14B, formed with an inter-terminal portion 54*c* extending in a direction parallel to the arranging direction of the fuse-installation portions 52*a* so as to pass through between the fuse-connection terminals 23*a*, 24*i*. From the inter-terminal portion 54*c* through the lateral side of the conductor pair 23', 24', the direct connection portions 54*b* protrudes downward from the lower surface of the insulation housing 52, the protruded end of the direct connection portion 54*b* bent toward the bus bar layer BL to be connected to the input bus bar 22.

This structure allows the branch-connection bus bar 54 to extend in a direction parallel to the arranging direction of the fuse-installation portions 52*a* by effective utilization of a space between the fuse-connection terminal pair 23*a*, 24*i*, thus allowing the direct-connection portions 54*b* to be formed at a desirable position in the bus bar 5.

The position of the inter-terminal portion 54*c* is not limited to the space between the fuse-connection terminal 23*a* of the fuse-input conductor 23' and the fuse-connection terminal 24*a* of the fuse-output conductor 24'. For example, the inter-terminal portion 54*c* may be interposed between the fuse-connection terminal 23*a* of the power-input conductor 23 and the fuse-connection terminal 53*a* of the power-connection conductor 53 as shown in FIG. 6C, or between the fuse-connection terminal of the output conductor and the fuse-connection terminal of a corresponding one of the external-output conductors.

As described above, there is a fuse module for supplying a power from a common power supply to a plurality of power input sections of a circuit assembly through respective fuse elements. The fuse module comprises: a branch-connection conductor having an input terminal adapted to be connected to the power supply and a plurality of fuse-connection terminals disposed correspondingly to the respective power input sections; a plurality of power-input conductors electrically connected to a corresponding one of the power input sections and each having a fuse-connection terminal disposed in a pair with a corresponding one of the fuse-connection terminals of the branch-connection conductor; and an insulation housing holding the branch-connection conductor and the power-input conductors. The insulation housing is formed with a plurality of fuse-installation portions for allowing the respective fuse elements to be detachably installed therein in such a manner that each of the fuse elements is connected to the fuse-connection terminal of the branch-connection conductor and the corresonding fuse-connection terminal of the power-input conductor, to be interposed between the fuse-connection terminals of the each pair.

According to the above fuse module, a power input from the power supply into the input terminal of the branch-connection conductor is distributed to the respective power input sections of the circuit assembly through the corresponding fuse elements and the corresponding fuse-connection terminals of the power-input conductors. If an overcurrent occurs in any circuit, a corresponding one of the fuse elements will be fused to protect the circuit. Better still, the fuse elements are installed into the fuse-installation portions formed in the common insulation housing, which enable concentrated management and easy replacement of the fuse elements.

That is, the present invention has an effect of distributing a power from a common power supply to the two or more power input sections while protecting the circuits with the fuse elements and enabling replacement and concentrated management of the fuse elements.

In the case where the circuit assembly has a plurality of bus bars including a plurality of input bus bars corresponding to the power input sections and the bus bars are arranged to form a power circuit, each of the input bus bars may have an end which is formed with the fuse-connection terminal and held in the insulation housing to serve as the power-input conductor. These input bus can bars can be additionally used as the power-input conductors to reduce the number of components and enhance reliability in connection.

On the other hand, each of the power-input conductors may have an electric-connection potion protruding outside the insulation housing to be electrically connected to a corresponding one of the power input sections of the circuit assembly, which makes it possible to construct the fuse module independently of the circuit assembly.

In this fuse module, each of the power-input conductors may be provided with a press-fit potion as the electric-connection portion, the press-fit portion adapted to be press-fitted into a through-hole formed in a corresponding one of the power input sections to be electrically connected to the power input section, which enables an interconnection between the power-input conductor and the power input section in a simplified structure without the need for soldering or the like.

The conductors and the fuse-installation portions may be formed in any suitable shape and arranged in any suitable pattern. Preferably, the plurality of fuse-installation portions formed in the insulation housing are arranged along a direction orthogonal to an aligning direction of the fuse-connection terminals of the pair in each of the fuse-installation portions, and the branch-connection conductor extends along an direction in which the pairs of the fuse-connection terminals are arranged. In this case, both the fuse-installation portions and the branch-connection portions can be disposed along a specific direction to reduce the entire height dimension (that is a size in a direction orthogonal to the specific direction) of the module.

In the present invention, the fuse module may include any suitable conductor other than the branch-connection conductor and the power-input conductor.

For example, the fuse module may include a power-connection conductor having an input terminal adapted to be connected to an additional power supply other than the power supply to be connected to the input terminal of the branch-connection conductor, and a fuse-connection terminal. In this fuse module, the insulation housing holds the power-connection conductor and a specific one adapted to be electrically connected to a specific one of the power input sections. The specific power-power-input conductor has an end formed with a fuse-connection terminal. The insulation housing is formed with a fuse-installation portion for allowing one of the fuse elements to be detachably installed therein in such a manner that the fuse element is connected to the fuse-connection terminal of the power-connection conductor and the fuse-connection terminal of the specific power-input conductor, and interposed between the two fuse-connection terminals. This makes it possible to input a power to the circuit assembly through a different line from the branch-connection conductor.

In this case, the branch-connection conductor and the power-connection conductor may be disposed such that each of the fuse-connection terminals formed in the branch-connection conductor and the fuse-connection terminal formed in the power-connection conductor are aligned approximately in a line. This enables a power input through a plurality of lines with a small height dimension of the entire module.

The fuse module of the present invention may include an output conductor which is adapted to be connected to a power output section provided in the circuit assembly and has a fuse-connection terminal at an end, and an external-output conductor which has an external-output terminal and a fuse-connection terminal. In this fuse module, the insulation housing holds the output conductor and the external-output conductor, formed with a fuse-installation potion in which one of the fuse elements is detachably installed in such a manner that the fuse-connection terminal of the corresponding external-output conductor, to be interposed between the two fuse-connection terminals. This makes it possible to interpose the fuse element between the input terminal of the branch-connection conductor and each of the power input sections of the circuit assembly, and further to output a power from the power output section of the circuit assembly to an external circuit through the fuse element and the external-installation portions formed in the common insulation housing, which enable concentrated management of the fuse elements interposed between the power output section and the external-output conductor with the fuse elements interposed between the branch-connection conductor and the respective power input sections.

In this fuse module, when the circuit assembly has a plurality of bus bars including an output bus bar corresponding to the power output section, and the bus bars are arranged to form a power circuit, the output bus bar may have an end which is formed with fuse-connection terminal and directly held within the insulation housing to serve as the power-output conductor. In this case, the output bus bars can be additionally used as the power-output conductors to reduce the number of components and enhance reliability in connection. Otherwise, the power-output conductor may have an electric-connection portion which is formed to protrude outside the insulation housing, and electrically connected to the power output section of the circuit assembly, which makes it possible to construct the fuse module independently of the circuit assembly.

The branch-connection conductor may include not only the fuse-connected terminals, but also a direct-connection portion adapted to be electrically connected directly to a specific one of the power input sections in the circuit assembly without interposition of the fuse element. This enables both a power input through the fuse elements and a direct power input without interposition of the fuse element into the circuit assembly, with the common branch-connection conductor.

In a specific embodiment, the branch-connection conductor may include an inter-terminal portion extending in a direction parallel to an arranging direction of the fuse-installation portions in the insulation housing so as to pass through between the fuse-installation portions of the insulation housing, the direct-connection portion extending from the inter-terminal portion toward the specific power input section. This allows the branch-connection bus bar to extend in a direction parallel to the arranging direction of the fuse-installation portions in the insulation housing with effective utilization of a space between the fuse-connection terminals of the pair, and enables a direct power input from the inter-terminal potion disposed between the fuse-connection terminals of the pair to the circuit assembly through the direct-connection portion without interposition of the fuse element. Thus, even if the power input sections of the circuit assembly are located at spaced-apart positions between which the output conductor and the external-output conductor exist, a power can be input from the branch-connection conductor to each of the power input sections.

The present invention provides also a fuse module-equipped circuit assembly comprising the above fuse module, and a circuit assembly having a plurality of power input sections, each of the power-input conductors of the fuse module electrically connected to a corresponding one of the power input sections.

This circuit assembly enables a power distribution from a comma power supply to a plurality of the power input sections through the fuse elements, in a simple structure where the fuse module is simply attached to the circuit assembly.

In the fuse module-equipped circuit assembly, the circuit assembly may include a current-detection bus bar with an input terminal and an output terminal between which a detection-target current is allowed to flow, at least one of the input terminal and output terminals held in the insulation housing. The incorporation of the current-detection bus bar in the circuit assembly add a current-detection function to the circuit assembly, while at least one of the input and output terminals of the current-detection bus bar being held in a simple structure with utilization of the insulation housing.

Further, the insulation housing may hold the output terminal of the current-detection bus bar and the input terminal of the branch-connection conductor in a state that the output terminal and the input terminal are superimposed on each other. This structure enables electrical interconnection between the output terminal of the current-detection bus and the input terminal of the branch-connection conductor, which allows a power distribution circuit comprising the fuse module and the circuit assembly to be connected to a downtown side of the current-detection bus bar.

The present invention further provides a structure for mounting the above fuse module to a vehicle, wherein the input terminal of the branch-connection conductor is fixed to a vehicle-mounted device or a vehicle body, while superimposed on a circuit-connection bus bar for connecting a power supply connected to the input terminal to another vehicle-mounted circuit.

The mounting structure realizes both an connection of the input terminal of the branch-connection conductor and an external circuit to the power supply, and a fixation of the fuse module simultaneously only with fasting the input terminal of the branch-connection conductor to a vehicle-mounted device or a vehicle body in a state that input terminal is superimposed onto the external-circuit-connection bus bar.

What is claimed is:

1. A fuse module for supplying power from a common power supply to a plurality of power input sections of a circuit assembly through respective fuse elements, the fuse module comprising:
    a branch-connection conductor having an input terminal adapted to be connected to said power supply, and a plurality of fuse-connection terminals disposed correspondingly to said respective power input sections;
    a plurality of power-input conductors adapted to be electrically connected to a corresponding one of said power input sections, and each having a fuse-connection terminal disposed in a pair with a corresponding one of the fuse-connection terminals of said branch-connection conductor; and
    an insulation housing holding said branch-connection conductor and said plurality of power-input conductors, said insulation housing being formed with a plurality of fuse-installation portions for allowing said respective fuse elements to be detachably installed therein in such a manner that each of said fuse elements is connected to a fuse-connection terminal of said branch-connection conductor and the corresponding fuse-connection terminal of one of said plurality of power-input conductors to be interposed between said fuse-connection terminals of the each pair,
    wherein each of said power-input conductors has an electric-connection portion protruding outside said insulation housing to be electrically connected to a corresponding one of the power input sections of said circuit assembly,
    wherein said circuit assembly has a plurality of bus bars including a plurality of input bus bars corresponding to said power input sections, said bus bars being arranged to form a power circuit, wherein each of said power-input conductors is provided with a press-fit portion as the electric-connection portion, the press-fit portion adapted to be press-fitted into a through-hole formed in a corresponding one of said input bus bars to be electrically connected to said input bus bar.

2. A fuse-module mounting structure for mounting the fuse module as defined in claim 1 to a vehicle, wherein the input terminal of said branch-connection conductor is fixed to a vehicle-mounted device or a vehicle body, while superimposed on a circuit-connection bus bar for connecting a power supply connected to said input terminal to another vehicle-mounted circuit.

3. A fuse module for supplying power from a common power supply to a plurality of power input sections of a circuit assembly through respective fuse elements, the fuse module comprising:
    a branch-connection conductor having an input terminal adapted to be connected to said power supply, and a plurality of fuse-connection terminals disposed correspondingly to said respective power input sections;
    a plurality of power-input conductors adapted to be electrically connected to a corresponding one of said power input sections, and each having a fuse-connection terminal disposed in a pair with a corresponding one of the fuse-connection terminals of said branch-connection conductor; and
    an insulation housing holding said branch-connection conductor and said plurality of power-input conductors, said insulation housing being formed with a plurality of fuse-installation portions for allowing said respective fuse elements to be detachably installed therein in such a manner that each of said fuse elements is connected to one of the fuse-connection terminals of said branch-connection conductor and the corresponding fuse-connection terminal of one of said plurality of power-input conductors to be interposed between said fuse-connection terminals of the each pair, the fuse module further comprising:
    a power-connection conductor having a fuse-connection terminal, and an input terminal adapted to be connected to an additional power supply other than said power supply to be connected to the input terminal of said branch-connection conductor, wherein:
    a specific one of said power-input conductors is associated with said power-connection conductor and adapted to be electrically connected to a specific one of said power input sections, said specific power-input conductor having an end formed with a fuse-connection terminal; and
    said insulation housing holds said power-connection conductor and said specific power-input conductor, said insulation housing being formed with a fuse-installation portion for allowing one of said fuse elements to be detachably installed therein in such a manner that said fuse element is connected to the fuse-connection terminal of said power-connection conductor and the fuse-connection terminal of said specific power-input conductor, and interposed between said two fuse-connection terminals.

4. The fuse module as defined in claim 3, wherein said branch-connection conductor and said power-connection conductor are disposed such that the fuse-connection terminals formed in said branch-connection conductor and the fuse-connection terminal formed in said power-connection conductor are aligned approximately in a line.

5. A fuse module for supplying power from a common power supply to a plurality of power input sections of a circuit assembly through respective fuse elements, the fuse module comprising:
    a branch-connection conductor having an input terminal adapted to be connected to said power supply, and a plurality of fuse-connection terminals disposed correspondingly to said respective power input sections;
    a plurality of power-input conductors adapted to be electrically connected to a corresponding one of said power input sections, and each having a fuse-connection terminal disposed in a pair with a corresponding one of the fuse-connection terminals of said branch-connection conductor; and an insulation housing holding said branch-connection conductor and said plurality of power-input conductors, said insulation housing being formed with a plurality of fuse-installation portions for allowing said respective fuse elements to be detachably installed therein in such a manner that each of said fuse elements is connected to a fuse-connection terminal of said branch-connection conductor and the corresponding fuse-connection terminal of one of said plurality of power-input conductors to be interposed between said fuse-connection terminals of the each pair, the fuse module further comprising:

an output conductor adapted to be connected to a power output section provided in said circuit assembly, said output conductor having an end formed with a fuse-connection terminal; and an external-output conductor having a fuse-connection terminal, and an external-output terminal adapted to be connected to an external circuit, wherein;

said insulation housing holds said output conductor and said external-output conductor, said insulation housing being formed with a fuse-installation portion for allowing one of said fuse elements to be detachably installed therein in such a manner that said fuse element is connected to the fuse-connection terminal of said output conductor and the fuse-connection terminal of said corresponding external-output conductor to be interposed between said two fuse-connection terminals.

6. The fuse module as defined in claim 5, wherein said circuit assembly has a plurality of bus bars including an output bus bar corresponding to said power output section, said bus bars being arranged to form a power circuit, wherein said output bus bar has an end which is formed with said fuse-connection terminal and held within said insulation housing to serve as said output conductor.

7. The fuse module as defined in claim 5, wherein said output conductor has an electric-connection portion protruding outside said insulation housing to be electrically connected to the power output section of said circuit assembly.

8. A fuse module mounting structure for mounting the fuse module as defined in claim 5 to a vehicle, wherein the input terminal of said branch-connection conductor is fixed to a vehicle-mounted device or a vehicle body, while superimposed on a circuit-connection bus bar for connecting a power supply connected to said input terminal to another vehicle-mounted circuit.

9. A fuse module for supplying power from a common power supply to a plurality of power input sections of a circuit assembly through respective fuse elements, the fuse module comprising:

a branch-connection conductor having an input terminal adapted to be connected to said power supply, and a plurality of fuse-connection terminals disposed correspondingly to said respective power input sections;

a plurality of power-input conductors adapted to be electrically connected to a corresponding one of said power input sections, and each having a fuse-connection terminal disposed in a pair with a corresponding one of the fuse-connection terminals of said branch-connection conductor; and an insulation housing holding said branch-connection conductor and said plurality of power-input conductors, said insulation housing being formed with a plurality of fuse-installation portions for allowing said respective fuse elements to be detachably installed therein in such a manner that each of said fuse elements is connected to a fuse-connection terminal of said branch-connection conductor and the corresponding fuse-connection terminal of one of said plurality of power-input conductors to be interposed between said fuse-connection terminals of the each pair, wherein said branch-connection conductor includes:

a direct-connection portion adapted to be electrically connected directly to a specific one of said power input sections in said circuit assembly without interposition of said fuse element, and an inter-terminal portion extending in a direction parallel to an arranging direction of said fuse-installation portions in said insulation housing so as to pass through between said fuse-connection terminals of said pair disposed at a specific one of said fuse-installation portions of said insulation housing, wherein said direct-connection portion extends from said inter-terminal portion toward said specific power input section.

10. A fuse module mounting structure for mounting the fuse module as defined in claim 9 to a vehicle, wherein the input terminal of said branch-connection conductor is fixed to a vehicle-mounted device or a vehicle body, while superimposed on a circuit-connection bus bar for connecting a power supply connected to said input terminal to another vehicle-mounted circuit.

11. A fuse module-equipped circuit assembly comprising a fuse module and a circuit assembly, the fuse module supplying power from a common power supply to a plurality of power input sections of said circuit assembly through respective fuse elements, the fuse module comprising:

a branch-connection conductor having an input terminal adapted to be connected to said power supply, and a plurality of fuse-connection terminals disposed correspondingly to said respective power input sections;

a plurality of power-input conductors adapted to be electrically connected to a corresponding one of said power input sections, and each having a fuse-connection terminal disposed in a pair with a corresponding one of the fuse-connection terminals of said branch-connection conductor; and an insulation housing holding said branch-connection conductor and said plurality of power-input conductors, said insulation housing being formed with a plurality of fuse-installation portions for allowing said respective fuse elements to be detachably installed therein in such a manner that each of said fuse elements is connected to a fuse-connection terminal of said branch-connection conductor and the corresponding fuse-connection terminal of one of said plurality of power-input conductors to be interposed between said fuse-connection terminals of the each pair, wherein each of the power-input conductors of said fuse module is electrically connected to a corresponding one of said power input sections, the circuit assembly comprising a current-detection bus bar provided with an input terminal and an output terminal between which a detection-target current is allowed to flow, at least one of said input and output terminals being held in said insulation housing.

12. The fuse module-equipped circuit assembly as defined in claim 11, wherein said insulation housing holds the output terminal of said current-detection bus bar and the input terminal of said branch-connection conductor in a state that the output terminal and the input terminal are superimposed on each other.

13. A fuse module mounting structure for mounting the fuse module as defined in claim 11 to a vehicle, wherein the input terminal of said branch-connection conductor is fixed to a vehicle-mounted device or a vehicle body, while superimposed on a circuit-connection bus bar for connecting a power supply connected to said input terminal to another vehicle-mounted circuit.

* * * * *